United States Patent
Akiyoshi

(10) Patent No.: US 10,115,523 B2
(45) Date of Patent: Oct. 30, 2018

(54) CERAMIC ELECTRONIC COMPONENT AND MOUNTING STRUCTURE OF THE SAME

(71) Applicant: Murata Manufacturing Co., Ltd., Nagaokakyo-shi, Kyoto-fu (JP)

(72) Inventor: Teppei Akiyoshi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/709,549

(22) Filed: Sep. 20, 2017

(65) Prior Publication Data

US 2018/0082784 A1 Mar. 22, 2018

(30) Foreign Application Priority Data

Sep. 21, 2016 (JP) ................. 2016-184699

(51) Int. Cl.
| | |
|---|---|
| H01G 4/232 | (2006.01) |
| H01G 4/002 | (2006.01) |
| H01G 2/04 | (2006.01) |
| H01G 2/06 | (2006.01) |
| H01G 4/012 | (2006.01) |
| H01G 4/008 | (2006.01) |
| H01G 4/258 | (2006.01) |

(Continued)

(52) U.S. Cl.
CPC ............ *H01G 4/232* (2013.01); *H01G 2/04* (2013.01); *H01G 2/06* (2013.01); *H01G 4/002* (2013.01); *H01G 4/008* (2013.01); *H01G 4/012* (2013.01); *H01G 4/258* (2013.01); *H01G 4/33* (2013.01); *H01G 4/1227* (2013.01); *H01G 4/1236* (2013.01); *H01G 4/248* (2013.01)

(58) Field of Classification Search
CPC ........ H01G 4/232; H01G 4/002; H01G 4/008; H01G 4/012; H01G 4/258; H01G 4/33; H01G 4/1227; H01G 4/1236; H01G 4/248; H01G 2/04; H01G 2/06
See application file for complete search history.

(56) References Cited

U.S. PATENT DOCUMENTS

| 6,046,902 A * | 4/2000 | Nakagawa | H01G 4/228 361/306.1 |
|---|---|---|---|
| 6,366,443 B1 * | 4/2002 | Devoe | H01G 4/228 361/303 |

(Continued)

FOREIGN PATENT DOCUMENTS

JP 11-54357 A 2/1999

*Primary Examiner* — Dion R Ferguson
(74) *Attorney, Agent, or Firm* — Keating & Bennett, LLP

(57) ABSTRACT

A ceramic electronic component includes a multilayer body, an electronic component main body including first and second outer electrodes on the surface of multilayer body, a first substrate connection terminal bonded to at least one of the first outer electrode and the multilayer body by a bonding material that is electrically insulating, and a first metal terminal electrically connecting the first outer electrode and the first substrate connection terminal, in which, while the first metal terminal maintains an elastically deformed state, a first end portion thereof is bonded to the first outer electrode by an electrically conductive bonding material, and a second end portion thereof is bonded to the first substrate connection terminal by a bonding section with a different melting point from that of the bonding material.

20 Claims, 9 Drawing Sheets

(51) Int. Cl.
  *H01G 4/33*  (2006.01)
  *H01G 4/12*  (2006.01)
  *H01G 4/248*  (2006.01)

(56) References Cited

U.S. PATENT DOCUMENTS

| | | | |
|---|---|---|---|
| 9,269,491 B2* | 2/2016 | Park | H01G 2/065 |
| 2005/0041367 A1* | 2/2005 | Yoshii | H01G 2/065 |
| | | | 361/303 |
| 2010/0123995 A1* | 5/2010 | Otsuka | H01G 2/06 |
| | | | 361/308.1 |
| 2014/0284091 A1* | 9/2014 | Fujii | H01G 4/30 |
| | | | 174/260 |
| 2014/0345927 A1* | 11/2014 | Itagaki | H01G 2/065 |
| | | | 174/260 |
| 2015/0008026 A1* | 1/2015 | Orimo | H01G 4/30 |
| | | | 174/260 |
| 2016/0086730 A1* | 3/2016 | Park | H01G 4/30 |
| | | | 174/260 |
| 2016/0118190 A1* | 4/2016 | Park | H01G 4/30 |
| | | | 174/260 |
| 2016/0126015 A1* | 5/2016 | Park | H01G 4/30 |
| | | | 174/260 |
| 2017/0164479 A1* | 6/2017 | Park | H05K 1/181 |

* cited by examiner

CERAMIC ELECTRONIC COMPONENT AND MOUNTING STRUCTURE OF THE SAME

CROSS REFERENCE TO RELATED APPLICATIONS

This application claims the benefit of priority to Japanese Patent Application No. 2016-184699 filed on Sep. 21, 2016. The entire contents of this application are hereby incorporated herein by reference.

BACKGROUND OF THE INVENTION

1. Field of the Invention

The present invention relates to a ceramic electronic component and a mounting structure thereof.

2. Description of the Related Art

When a short-circuit path is formed in a ceramic electronic component due to failure, a short circuit is formed in an electronic apparatus in which the ceramic electronic component is incorporated, and a current not less than a rated current (hereinafter, referred to simply as "overcurrent") flows in the electronic apparatus in some cases. As a result, there are risks that the ceramic electronic component itself, a battery and a conductor connected to the short circuit in the electronic apparatus, or the like will generate abnormal heat, and smoking and fire will occur. In order to solve such a problem, a circuit configuration in which a current fuse or the like capable of cutting off the overcurrent is incorporated has been known. For example, in a circuit that needs to incorporate a multilayer ceramic capacitor (ceramic electronic component) to span across PN of a DC line, a current fuse may be used together, as illustrated in FIG. 14A, for the purpose of preventing abnormal heat generation by a short circuit caused by failure of the multilayer ceramic capacitor, smoking and fire, or the like. However, in such a case, there are a problem that the circuit does not function due to the current fuse functioning and a problem in reliability with respect to the current fuse. Note that, in FIG. 14A, a substantially rectangular shape located on a right side is an inverter. Additionally, the same applies in FIG. 14B which will be described next.

As illustrated in FIG. 14B, a plurality of multilayer ceramic capacitors connected in series may be used. With this configuration, even when one multilayer ceramic capacitor fails and a short-circuit path is formed therein, other multilayer ceramic capacitors cut off a DC current, and thus it is possible to avoid that a short circuit is formed. As a result, even in the case where the current fuse functions, the circuit continues to function, and abnormal heat generation or the like caused by failure of the multilayer ceramic capacitor can be prevented. However, when one multilayer ceramic capacitor fails actually in such a circuit, and a short-circuit path is formed therein, there are risks that the faulty multilayer ceramic capacitor will generate abnormal heat, a mounting substrate and combustibles in the periphery will burn, and smoking and fire will arise, depending on the state of the failure and a ripple current flowing in the multilayer ceramic capacitor. Note that, a current fuse, which functions when all the multilayer ceramic capacitors connected in series fail, is also used in many cases. However, because such a current fuse does not function when only one multilayer ceramic capacitor fails, for example, the above-described abnormal heat generation or the like cannot be avoided in the same manner.

Additionally, in an LC resonance circuit as illustrated in FIG. 14C, when only an AC load with a frequency which makes impedance of a multilayer ceramic capacitor sufficiently small is applied, impedance of the multilayer ceramic capacitor with a short-circuit path formed therein does not become sufficiently small in comparison with impedance of a multilayer ceramic capacitor component. With this, a current flowing in the circuit does not become extremely large. Accordingly, even if a current fuse is connected in series, it does not function. However, there are risks that the faulty multilayer ceramic capacitor will generate abnormal heat by an AC current flowing therein, a mounting substrate and combustibles in the periphery will burn, and smoking and fire will arise. Note that, in the LC resonance circuit as illustrated in FIG. 14C, in the case where a plurality of multilayer ceramic capacitors are connected in series, or in the case where the plurality of multilayer ceramic capacitors, which are connected in series, are connected in parallel, a change in a current as a whole by failure of one multilayer ceramic capacitor among them becomes smaller.

Additionally, regardless of a circuit configuration, failure of a ceramic electronic component is not limited to the case where a short-circuit path is formed therein. For example, deterioration or failure such as to cause heat generation more than expected by simple increase in loss may also arise. However, because a current fuse cannot cope with such failure of course, smoking and fire, or the like as described above cannot be avoided. Note that, it can also be considered that a temperature fuse which functions by detecting temperature is used. However, because the temperature fuse cannot directly detect temperature of a ceramic electronic component, the temperature fuse takes time until it operates. As a result, smoking and fire by the abnormal heat generation as described above cannot be avoided. Furthermore, using the ceramic electronic component in which the heat generation at the failure is expected together with the current fuse as described above may make a circuit design or assembly difficult. Additionally, this causes increase in ESR or ESL of the circuit, prevents a performance of the ceramic electronic component in the circuit from exerting, and thus is not realistic.

Furthermore, as an electronic component with a safety function disclosed in Japanese Unexamined Patent Application Publication No. 11-54357, a technique in which a fuse is directly attached to a ceramic electronic component to cause the ceramic electronic component itself to have a fuse function has also been known. Japanese Unexamined Patent Application Publication No. 11-54357 discloses a technique in which two ceramic capacitor elements are included, conductive paint having silver-palladium (Ag—Pd, hereinafter) as its primary component is applied on each side surface thereof and dried to form outer electrodes, a substantially U-shaped external terminal is fixed on one outer electrode with a glass layer interposed therebetween and the external terminal is connected to the outer electrode through a current fuse, the other outer electrode is connected to the substantially U-shaped external terminal, and therefore, when an overcurrent continuously flows in a capacitor element, the current fuse will melt and the capacitor is separated from the circuit.

However, as in Japanese Unexamined Patent Application Publication No. 11-54357, in the case where a fuse is directly attached to a ceramic electronic component, it is necessary to make an outer electrode of the ceramic electronic component thin, or to make the fuse itself thin. Additionally, a current path is complicated in the ceramic electronic component, which causes an increase in ESL and deterioration in high-frequency characteristics, an increase in ESR and an increase in heat generation and loss, and furthermore, a decrease in an allowable current. In other words, there are problems that the ceramic electronic component in Japanese Unexamined Patent Application Publication No. 11-54357 has low performance in comparison with an electronic component without a fuse function, and has completely insufficient performance depending on an incorporated circuit.

SUMMARY OF THE INVENTION

Preferred embodiments of the present invention provide ceramic electronic components and mounting structures thereof that are able to reliably open a circuit and prevent abnormal heat generation and an accident such as smoking, fire, or the like which may be caused by the abnormal heat generation, upon failure as described above without lowering performance thereof.

A ceramic electronic component according to a preferred embodiment of the present invention includes a multilayer body with a rectangular parallelepiped or substantially rectangular parallelepiped shape by alternately laminating a plurality of ceramic layers, a plurality of first inner electrode layers, and a plurality of second inner electrode layers, the multilayer body including a first main surface and a second main surface opposing each other in a lamination direction, a first side surface and a second side surface opposing each other in a width direction orthogonal or substantially orthogonal to the lamination direction, and a first end surface and a second end surface opposing each other in a length direction orthogonal or substantially orthogonal to the lamination direction and the width direction; a first outer electrode electrically connected to the plurality of first inner electrode layers and on at least the first end surface of the multilayer body, and a second outer electrode electrically connected to the plurality of second inner electrode layers and located on at least the second end surface of the multilayer body; a first substrate connection terminal bonded to at least one of the first outer electrode and the multilayer body by a bonding material that electrically insulates the first substrate connection terminal from the first outer electrode, and a second substrate connection terminal bonded to at least one of the second outer electrode and the multilayer body by a bonding material that electrically insulates the second substrate connection terminal from the second outer electrode; and a first metal terminal electrically connecting the first outer electrode and the first substrate connection terminal, and a second metal terminal electrically connecting the second outer electrode and the second substrate connection terminal, in which, while the first metal terminal maintains an elastically deformed state, a first end portion of the first metal terminal is bonded to the first outer electrode by an electrically conductive bonding material and a second end portion of the first metal terminal is bonded to the first substrate connection terminal by a bonding section with a different melting point from a melting point of the electrically conductive bonding material, and while the second metal terminal maintains an elastically deformed state, a first end portion of the second metal terminal is bonded to the second outer electrode by an electrically conductive bonding material and a second end portion of the second metal terminal is bonded to the second substrate connection terminal by a bonding section with a different melting point from a melting point of the electrically conductive bonding material.

Preferably, for example, a portion where the first end portion of the first metal terminal and the first outer electrode are bonded and a portion where the first end portion of the second metal terminal and the second outer electrode are bonded are each coated by a resin with a low melting point to cover at least a surface of the electrically conductive bonding material.

Preferably, for example, each of the first metal terminal and the second metal terminal is coated by a resin with a low melting point.

Preferably, for example, each of the first metal terminal and the second metal terminal includes a comb structure or substantially comb body shape including a plurality of comb-tooth portions located on the first end portion side of each of the first metal terminal and the second metal terminal and a comb main portion located on the second end portion side of each of the first metal terminal and the second metal terminal.

Preferably, for example, each of the first metal terminal and the second metal terminal includes a plurality of terminals.

A mounting structure of a ceramic electronic component according to a preferred embodiment of the present invention includes the ceramic electronic component according to any one of the above descriptions, and a mounting substrate on which the ceramic electronic component is mounted, in which the first substrate connection terminal of the ceramic electronic component and a first land portion of the mounting substrate are electrically connected, and the second substrate connection terminal of the ceramic electronic component and a second land portion of the mounting substrate are electrically connected.

Preferably, for example, a first screw member to fix a state where the first substrate connection terminal of the ceramic electronic component and the first land portion of the mounting substrate are electrically connected, and a second screw member to fix a state where the second substrate connection terminal of the ceramic electronic component and the second land portion of the mounting substrate are electrically connected are further included.

A mounting structure of a ceramic electronic component according to a preferred embodiment of the present invention includes a ceramic electronic component and a mounting substrate on which the ceramic electronic component is mounted, in which the ceramic electronic component includes a multilayer body with a rectangular parallelepiped or substantially rectangular parallelepiped shape by alternately laminating a plurality of ceramic layers, a plurality of first inner electrode layers, and a plurality of second inner electrode layers, and including a first main surface and a second main surface opposing each other in a lamination direction, a first side surface and a second side surface opposing each other in a width direction orthogonal or substantially orthogonal to the lamination direction, and a first end surface and a second end surface opposing each other in a length direction orthogonal or substantially orthogonal to the lamination direction and the width direction; a first outer electrode electrically connected to the plurality of first inner electrode layers and located on at least the first end surface of the multilayer body, and a second outer electrode electrically connected to the plurality of second inner electrode layers and located on at least the second end surface of the multilayer body; and a first metal terminal electrically connecting the first outer electrode and the mounting substrate, and a second metal terminal electrically connecting the second outer electrode and the mounting substrate, the mounting substrate includes a first land portion electrically connected to the first outer electrode through the first metal terminal, and a second land portion electrically connected to the second outer electrode through the second metal terminal, and is bonded to at least one of the first outer electrode and the multilayer body by a bonding material that electrically insulates the mounting substrate from the first outer electrode and is bonded to at least one of the second outer electrode and the multilayer body by a bonding material that electrically insulates the mounting substrate from the second outer electrode, while the first metal terminal maintains an elastically deformed state, first end portion of the first metal terminal is bonded to the first outer electrode by an electrically conductive bonding material, and a second end portion of the first metal terminal is bonded to the first land portion by a bonding section with a different melting point from a melting point of the electrically conductive bonding material, and while the second metal terminal maintains an elastically deformed state, first end portion of the second metal terminal is bonded to the second outer electrode by an electrically conductive bonding material, and a second of the second metal terminal is bonded to the second land portion by a bonding section with a different melting point from a melting point of the electrically conductive bonding material.

Preferably, for example, a first screwing member to fix a state where the second end portion of the first metal terminal of the ceramic electronic component and the first land portion of the mounting substrate are electrically connected, and a second screwing member to fix a state where the second end portion of the second metal terminal of the ceramic electronic component and the second land portion of the mounting substrate are electrically connected are further included.

Preferably, for example, a portion where the first end portion of the first metal terminal and the first outer electrode are bonded and a portion where the first end portion of the second metal terminal and the second outer electrode are bonded are each coated by a resin with a low melting point.

Preferably, each of the first metal terminal and the second metal terminal is coated by a resin with a low melting point.

Preferably, for example, each of the first metal terminal and the second metal terminal includes a comb structure or substantially comb body shape including a plurality of comb-tooth portions located on the first end portion side of each of the first metal terminal and the second metal terminal and a comb main portion located on the second end portion side of each of the first metal terminal and the second metal terminal.

Preferably, for example, each of the first metal terminal and the second metal terminal includes a plurality of terminals.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
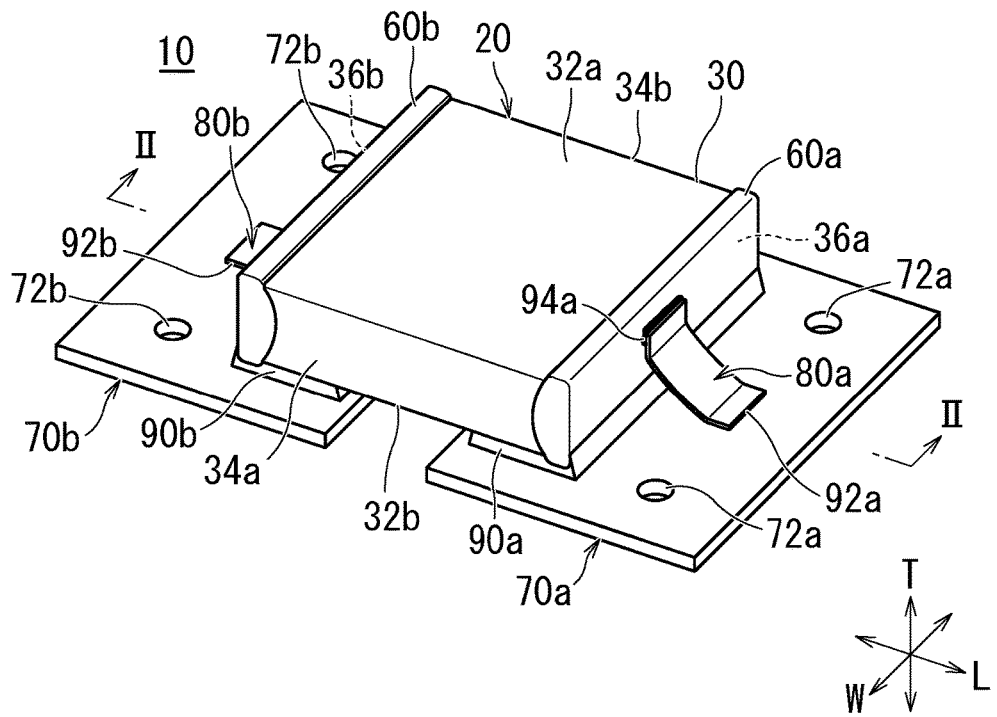
FIG. 1 is an external perspective view showing a ceramic electronic component according to a first preferred embodiment of the present invention.
Figure 2:
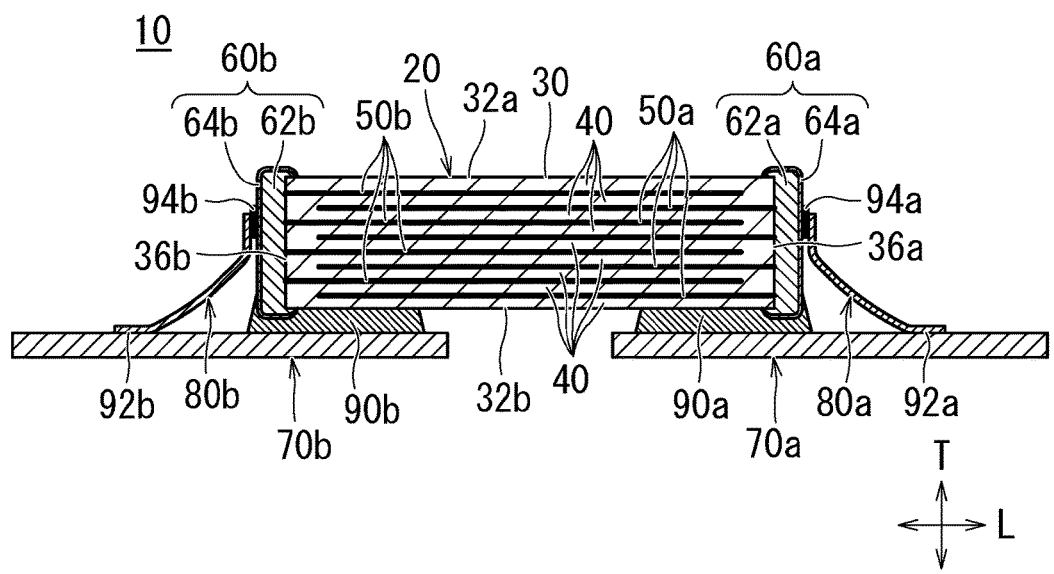
FIG. 2 is a cross-sectional view of the ceramic electronic component according to the first preferred embodiment of the present invention taken along a length direction.
Figure 3:
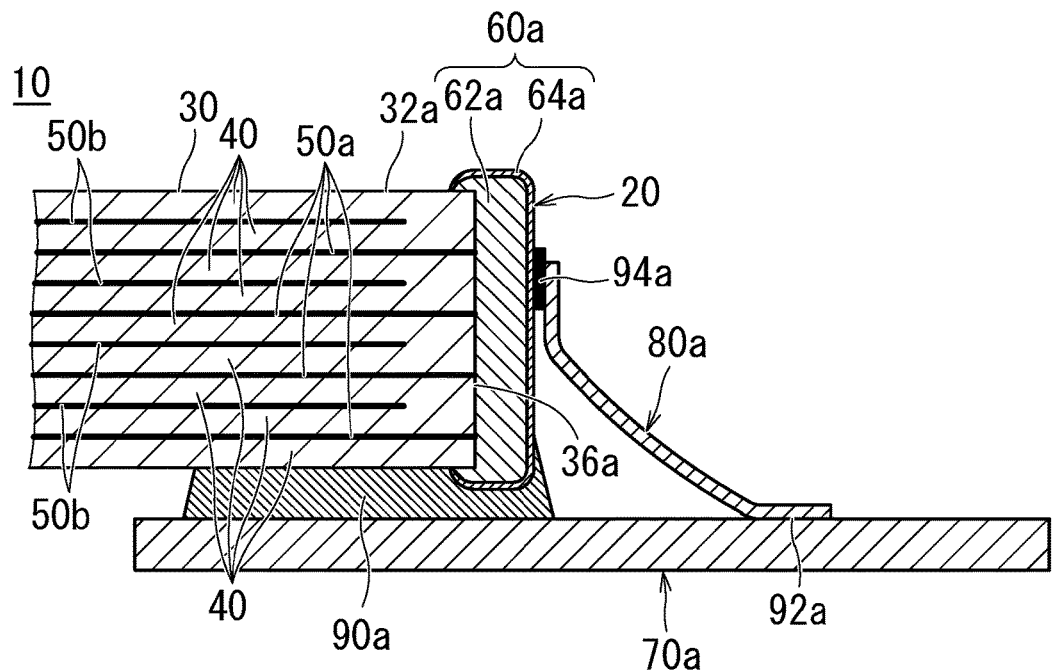
FIG. 3 is a cross-sectional view showing a normal state of the ceramic electronic component according to the first preferred embodiment of the present invention taken along the length direction and adjacent to or in a vicinity of a first outer electrode.
Figure 4:
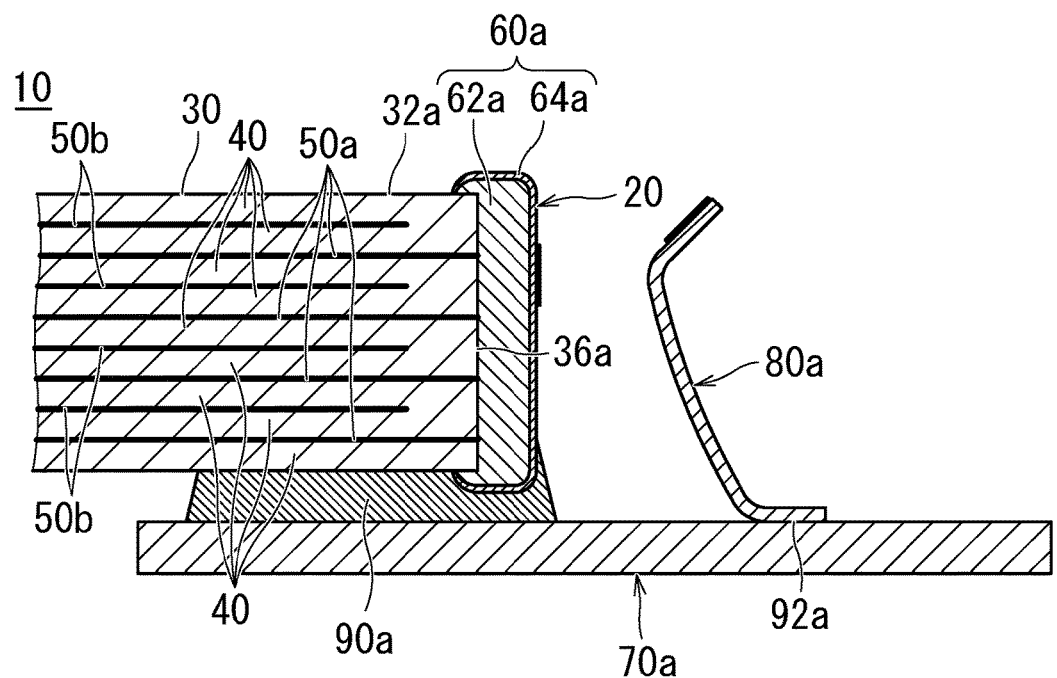
FIG. 4 is a cross-sectional view showing a state where an electrical connection of the ceramic electronic component according to the first preferred embodiment of the present invention is cut off taken along the length direction and adjacent to or in a vicinity of the first outer electrode.

Hereinafter, a ceramic electronic component according to a first preferred embodiment of the present invention will be described with reference to FIGS. 1 to 4. FIG. 1 is an external perspective view showing the ceramic electronic component according to the first preferred embodiment of the present invention. FIG. 2 is a cross-sectional view of the ceramic electronic component according to the first preferred embodiment of the present invention taken along a length direction. FIG. 3 is a cross-sectional view showing a normal state of the ceramic electronic component according to the first preferred embodiment of the present invention taken along the length direction and adjacent to or in a vicinity of a first outer electrode. FIG. 4 is a cross-sectional view showing a state where an electrical connection of the ceramic electronic component according to the first preferred embodiment of the present invention is cut off taken along the length direction and adjacent to or in a vicinity of the first outer electrode.

A ceramic electronic component 10 according to the present preferred embodiment includes an electronic component main body 20, a first substrate connection terminal 70a bonded to the electronic component main body 20 by a bonding material that is electrically insulating, and a first metal terminal 80a electrically connecting the electronic component main body 20 and the first substrate connection terminal 70a. Additionally, the ceramic electronic component 10 includes a second substrate connection terminal 70b bonded to the electronic component main body 20 by a bonding material that is electrically insulating, and a second metal terminal 80b electrically connecting the electronic component main body 20 and the second substrate connection terminal 70b.

The electronic component main body 20 includes a multilayer body 30 defined in a rectangular parallelepiped or substantially rectangular parallelepiped shape, and a first outer electrode 60a and a second outer electrode 60b located on a surface of the multilayer body 30.

The multilayer body 30 preferably with a rectangular parallelepiped or substantially rectangular parallelepiped shape is formed by alternately laminating a plurality of ceramic layers 40, a plurality of first inner electrode layers 50a, and a plurality of second inner electrode layers 50b. Additionally, the multilayer body 30 includes a first main surface 32a and a second main surface 32b opposing each other in a lamination direction (T direction shown in FIG. 1 and FIG. 2), a first side surface 34a and a second side surface 34b opposing each other in a width direction orthogonal or substantially orthogonal to the lamination direction (W direction shown in FIG. 1 and FIG. 2), and a first end surface 36a and a second end surface 36b opposing each other in a length direction orthogonal or substantially orthogonal to the lamination direction and the width direction (L direction shown in FIG. 1 and FIG. 2). A corner portion and a ridge line portion of the multilayer body 30 are preferably rounded, for example. Here, the corner portion of the multilayer body 30 refers to a portion where three surfaces of the main surfaces, the side surfaces, and the end surfaces of the multilayer body 30 described above intersect. Additionally, the ridge line portion of the multilayer body 30 refers to a portion where two surfaces of the main surfaces and the side surfaces of the multilayer body 30 described above intersect. The multilayer body 30, for example, is able to be formed with the L dimension of not less than about 4 mm and not more than about 50 mm, the W dimension of not less than about 3 mm and not more than about 50 mm, and the T dimension of not less than about 1.2 mm and not more than about 10 mm, but may be formed with other dimensions.

The ceramic layer 40 is laminated to be sandwiched between the first inner electrode layer 50a and the second inner electrode layer 50b. The thickness of the ceramic layer 40 per one layer is preferably not less than about 0.5 μm and not more than about 100 μm, for example. Additionally, as a ceramic material of the ceramic layer 40, for example, dielectric ceramics including $BaTiO_3$, $CaTiO_3$, $SrTiO_3$, $CaZrO_3$, or the like as its primary component are able to be included. Furthermore, secondary components, such as Mn compound, Fe compound, Cr compound, Co compound, Ni compound, or the like, less than the primary component content may be added to the primary components, for example.

The first inner electrode layer 50a extends on a boundary surface of the ceramic layer 40 in a planar or substantially planar shape, and an end portion thereof is exposed on the first end surface 36a of the multilayer body 30. The second inner electrode layer 50b extends on the boundary surface of the ceramic layer 40 in a planar or substantially planar shape to oppose the first inner electrode layer 50a with the ceramic layer 40 interposed therebetween, and an end portion thereof is exposed on the second end surface 36b of the multilayer body 30. Accordingly, the first inner electrode layer 50a includes an opposite electrode portion opposing the second inner electrode layer 50b with the ceramic layer 40 interposed therebetween, an extended electrode portion from the end portion of the opposite electrode portion on the first end surface 36a side to the first end surface 36a, and an exposed portion exposed from the first end surface 36a. The second inner electrode layer 50b includes an opposite electrode portion opposing the first inner electrode layer 50a with the ceramic layer 40 interposed therebetween, an extended electrode portion from the end portion of the opposite electrode portion on the second end surface 36b side to the second end surface 36b, and an exposed portion exposed from the second end surface 36b. By the opposite electrode portion of the first inner electrode layer 50a and the opposite electrode portion of the second inner electrode layer 50b opposing each other with the ceramic layer 40 interposed therebetween, electrostatic capacitance is produced. As a result, the ceramic electronic component 10 according to the present preferred embodiment defines and functions as a capacitor. However, the ceramic electronic component 10 may define and function as a piezoelectric component, for example, when a piezoelectric ceramic material such as PZT based ceramics or the like is included as a ceramic material. Additionally, the ceramic electronic component 10 may define and function as a thermistor, for example, when a semiconductor ceramic material such as spinel based ceramics or the like is included as a ceramic material. Furthermore, the ceramic electronic component 10 may define and function as an inductor, for example, when a magnetic ceramic material such as ferrite or the like is included as a ceramic material.

The thickness of each of the first inner electrode layer 50a and the second inner electrode layer 50b per one layer is preferably not less than about 0.2 μm and not more than about 2.0 μm, for example. Additionally, the first inner electrode layer 50a and the second inner electrode layer 50b may include conductive material such as a metal of Ni, Cu, Ag, Pd, Au, or the like, an alloy containing at least one type of these metals (for example, Ag—Pd alloy), or the like, for example.

The first outer electrode 60a is, by being located on at least the first end surface 36a of the multilayer body 30, electrically connected to the first inner electrode layer 50a. The first outer electrode 60a may extend, for example, from a portion located on the first end surface 36a of the multilayer body 30 and reach a portion of each of the first main surface 32a, the second main surface 32b, the first side surface 34a, and the second side surface 34b of the multilayer body 30. The second outer electrode 60b is, by being located on at least the second end surface 36b of the multilayer body 30, electrically connected to the second inner electrode layer 50b. The second outer electrode 60b may, for example, to extend from a portion located on the second end surface 36b of the multilayer body 30 and reach a portion of each of the first main surface 32a, the second main surface 32b, the first side surface 34a, and the second side surface 34b of the multilayer body 30.

The first outer electrode 60a includes a first base electrode layer 62a located on the surface of the multilayer body 30, and a first plating layer 64a located on a surface of the first base electrode layer 62a. The second outer electrode 60b includes a second base electrode layer 62b located on the surface of the multilayer body 30, and a second plating layer 64b located on a surface of the second base electrode layer 62b. Each of the first outer electrode 60a and the second outer electrode 60b includes solder.

The first base electrode layer 62a is located on at least the first end surface 36a of the multilayer body 30. The first base electrode layer 62a may, for example, extend from a portion located on the first end surface 36a of the multilayer body 30 and reach a portion of each of the first main surface 32a, the second main surface 32b, the first side surface 34a, and the second side surface 34b of the multilayer body 30. The second base electrode layer 62b is located on at least the second end surface 36b of the multilayer body 30. The second base electrode layer 62b may, for example, extend from a portion located on the second end surface 36b of the multilayer body 30 and reach a portion of each of the first main surface 32a, the second main surface 32b, the first side surface 34a, and the second side surface 34b of the multilayer body 30. The thickness of the thickest portion of each of the first base electrode layer 62a and the second base electrode layer 62b is preferably not less than about 10 μm and not more than about 200 μm, for example.

Each of the first base electrode layer 62a and the second base electrode layer 62b includes a conductive metal and glass. As the conductive metal for each of the first base electrode layer 62a and the second base electrode layer 62b, for example, Cu, Ni, Ag, Pd, an Ag—Pd alloy, Au, or the like may be included. As the glass for each of the first base electrode layer 62a and the second base electrode layer 62b, for example, B, Si, Ba, Mg, Al, Li, or the like may be included. Each of the first base electrode layer 62a and the second base electrode layer 62b including glass provides an increased close contact force with respect to the multilayer body 30. Each of the first base electrode layer 62a and the second base electrode layer 62b is able to be formed by applying conductive paste including the conductive metal and the glass, as described above, and baking. Each of the first base electrode layer 62a and the second base electrode layer 62b may be formed, for example, by being fired at the same or substantially the same time as the first inner electrode layer 50a and the second inner electrode layer 50b, may be formed, for example, by being baked after the first inner electrode layer 50a and the second inner electrode layer 50b are fired, or may be formed through other methods. As the other methods, for example, each of the above components and elements may include, for example, a resin layer containing conductive particles and thermosetting resin, or a thin film layer with a thickness of not more than about 1 μm including deposited metal particles or the like formed by a thin film formation method such as a sputtering method or a vapor deposition method or the like.

The first plating layer 64a covers the first base electrode layer 62a, on a surface thereof. The second plating layer 64b covers the second base electrode layer 62b, on a surface thereof. Each of the first plating layer 64a and the second plating layer 64b may include a plurality of layers, for example. Each of the first plating layer 64a and the second plating layer 64b preferably includes a dual-layer structure including a Ni plating layer and a Sn plating layer located on a surface of the Ni plating layer, for example. Forming the Ni plating layer on the surface of the first base electrode layer 62a significantly reduces or prevents erosion of the first base electrode layer 62a by solder. Additionally, because solder wettability significantly improves by forming the Sn plating layer on the surface of the Ni plating layer, an operation of bonding the first metal terminal 80a to the first outer electrode 60a is able to be easily performed. The Ni plating layer located on the surface of the second base electrode layer 62b and the Sn plating layer located on the surface of the Ni plating layer also provide similar effects and features, and thus descriptions thereof will not be repeated here. The thickness of each of the first plating layer 64a and the second plating layer 64b per one layer is preferably not less than about 1 μm and not more than about 15 μm, for example. The first plating layer 64a and the second plating layer 64b include, for example, at least one selected from Cu, Ni, Sn, Ag, Pd, an Ag—Pd alloy, Au, or the like.

The first substrate connection terminal 70a is bonded to at least one of the first outer electrode 60a and the multilayer body 30 by a bonding material that electrically insulates the first substrate connection terminal 70a from the first outer electrode 60a. The bonding material preferably extends from a surface of the first outer electrode 60a to a portion of the surface of the multilayer body 30, for example. Additionally, a gap between the first outer electrode 60a and the first substrate connection terminal 70a is preferably filled with the bonding material, for example. Thus, a bonding strength between the first substrate connection terminal 70a and the electronic component main body 20 is able to be significantly improved, and an insulation property between the first outer electrode 60a and the first substrate connection terminal 70a is able be made more reliable. In the following descriptions, a bonding portion for the first substrate connection terminal 70a is referred to as a first insulation bonding portion 90a.

The second substrate connection terminal 70b is bonded to at least one of the second outer electrode 60b and the multilayer body 30 by a bonding material that electrically insulates the second substrate connection terminal 70b from the second outer electrode 60b. The bonding material preferably extends from a surface of the second outer electrode 60b to a portion of the surface of the multilayer body 30, for example. Additionally, the bonding material is preferably provided with a gap between the second outer electrode 60b and the second substrate connection terminal 70b is filled with the bonding material, for example. Thus, a bonding strength between the second substrate connection terminal 70b and the electronic component main body 20 is able to be significantly improved, and an insulation property between the second outer electrode 60b and the second substrate connection terminal 70b is able to be made more reliable. In the following descriptions, a bonding portion for a second substrate connection terminal 70b is referred to as a second insulation bonding portion 90b.

In the first substrate connection terminal 70a, two first screw holes 72a used for mounting are bored. In the second substrate connection terminal 70b, two second screw holes 72b used for mounting are bored. Each of the first screw hole 72a and the second screw hole 72b includes a circular or substantially circular shape, when viewed in a plan view. Each of the first screw hole 72a and the second screw hole 72b is not limited to a circular or substantially circular shape, when viewed in a plan view, for example, may include an elliptical or substantially elliptical shape, a quadrangular or substantially quadrangular shape, a triangular or substantially triangular shape, or a branched Y or substantially branched Y shape, or the like, for example.

Each of the first substrate connection terminal 70a and the second substrate connection terminal 70b includes, for example, phosphor bronze, a high copper alloy, or the like. Additionally, as a bonding material that is electrically insulating, for example, a silicone based adhesive, an epoxy adhesive with a lower elastic modulus, or the like may be included.

The first metal terminal 80a electrically connects the first outer electrode 60a and the first substrate connection terminal 70a. The first metal terminal 80a includes a first end portion which is bonded to a portion of the first outer electrode 60a located on the first end surface 36a of the multilayer body 30; a main body portion which bends from an end edge of the first end portion on the first substrate connection terminal 70a side (that is, a lower side end edge in FIG. 2 and FIG. 3) and extends to an outer side portion while approaching the first substrate connection terminal 70a (that is, a right side in FIG. 2 and FIG. 3); and the second end portion which bends from an outer side portion end edge of the main body portion (that is, a right side end edge in FIG. 2 and FIG. 3) and is bonded to a surface of the first substrate connection terminal 70a. The second metal terminal 80b electrically connects the second outer electrode 60b and the second substrate connection terminal 70b. The second metal terminal 80b includes a first end portion which is bonded to a portion of the second outer electrode 60b located on the second end surface 36b of the multilayer body 30; a main body portion which bends from an end edge of the first end portion on the second substrate connection terminal 70b side (that is, a lower side end edge in FIG. 2) and extends to an outer side portion while approaching the second substrate connection terminal 70b (that is, a left side in FIG. 2); the second end portion which bends from an outer side portion end edge of the main body portion (that is, a left side end edge in FIG. 2) and is bonded to a surface of the second substrate connection terminal 70b.

While the first metal terminal 80a maintains an elastically deformed state, the first end portion thereof is bonded to the first outer electrode 60a by an electrically conductive bonding material, and the second end portion thereof is bonded to the first substrate connection terminal 70a by a bonding section with a different melting point from that of the bonding material. At this time, because the first metal terminal 80a attempts to return to its original shape from an elastically deformed shape, the first end portion thereof attempts to separate from the first outer electrode 60a, and the second end portion thereof attempts to separate from the first substrate connection terminal 70a. In other words, in FIG. 3 (and FIG. 2), the first metal terminal 80a attempts to rotate clockwise around the first end portion thereof, and attempts to rotate counterclockwise around the second end portion thereof. However, as described above, the first metal terminal 80a maintains the elastically deformed state, by the first end portion thereof being bonded to the first outer electrode 60a and the second end portion thereof being bonded to the first substrate connection terminal 70a. While the second metal terminal 80b maintains an elastically deformed state, the first end portion thereof is bonded to the second outer electrode 60b by an electrically conductive bonding material, and the second end portion thereof is bonded to the second substrate connection terminal 70b by a bonding section with a different melting point from that of the bonding material. At this time, because the second metal terminal 80b attempts to return to its original shape from an elastically deformed shape, the first end portion thereof attempts to separate from the second outer electrode 60b, and the second end portion thereof attempts to separate from the second substrate connection terminal 70b. In other words, in FIG. 2, the second metal terminal 80b attempts to rotate counterclockwise around the first end portion thereof, and attempts to rotate clockwise around the second end portion thereof. However, as described above, the second metal terminal 80b maintains the elastically deformed state, by the first end portion thereof being bonded to the second outer electrode 60b and the second end portion thereof being bonded to the second substrate connection terminal 70b.

Each of the first metal terminal 80a and the second metal terminal 80b includes an elastically deformable terminal main body. The terminal main body includes, for example, Ni, Fe, Cu, Ag, Cr, or an alloy containing one type or more of these metals as its primary component. The terminal main body is preferably a high copper alloy with a spring property, for example. Thus, the first metal terminal 80a and the second metal terminal 80b are able to prevent erroneous operations caused by heat generation by a current in normal operation. Additionally, the spring property thereof reliably separates the first metal terminal 80a and the second metal terminal 80b from the electronic component main body 20, when the electronic component main body 20 generates abnormal heat by failure or the like. Furthermore, equivalent series resistance (ESR) of the ceramic electronic component 10 is able to be significantly reduced. For the high copper alloy, as a base material, for example, C7025, C7035, phosphor bronze, beryllium copper, or the like are able to be included. The thickness of the terminal main body is preferably not less than about 0.05 mm and not more than about 0.5 mm, for example.

A plating layer may be located on a surface of the terminal main body, for example. The plating layer may include a lower layer plating located on the surface of the terminal main body, and an upper layer plating located on a surface of the lower layer plating, for example. Each of the lower layer plating and the upper layer plating may include a plurality of layers, for example. The lower layer plating preferably includes Ni, Fe, Cu, Ag, Cr, or an alloy containing one type or more of these metals as its primary component, for example. The lower layer plating more preferably includes Ni, Fe, Cr, or an alloy containing one type or more of these metals as its primary component, for example. Thus, the lower layer plating is able to define and function as a barrier layer, to significantly reduce or prevent mutual diffusion or alloying with a first solder bonding portion 94a and a second solder bonding portion 94b, and significantly improve heat resistance. The thickness of the lower layer plating is preferably not less than about 2.0 µm and not more than about 6.0 µm, for example. The upper layer plating includes, for example, Sn, Ag, Au, or an alloy containing one type or more of these metals as its primary component. The upper layer plating preferably includes Sn or an alloy containing Sn as its primary component, for example. Thus, solderability between the first metal terminal 80a and the first outer electrode 60a and solderability between the second metal terminal 80b and the second outer electrode 60b are able to be significantly improved. The thickness of the upper layer plating is preferably not less than about 2.0 µm and not more than about 10.0 µm, for example.

The bonding between the first end portion of the first metal terminal 80a and the first outer electrode 60a, and the bonding between the first end portion of the second metal terminal 80b and the second outer electrode 60b are performed by solder (bonding material). As the solder, for example, Sn based solder is able to be used. Sn based solder with various melting points (for example, solidus temperature of not lower than about 135° C. and not higher than about 183° C.) is able to be used. In the following descriptions, a portion where the first end portion of the first metal terminal 80*a* and the first outer electrode 60*a* are bonded is referred to as the first solder bonding portion 94*a*, a portion where the first end portion of the second metal terminal 80*b* and the second outer electrode 60*b* are bonded is referred to as the second solder bonding portion 94*b*.

The bonding between the second end portion of the first metal terminal 80*a* and the first substrate connection terminal 70*a* and the bonding between the second end portion of the second metal terminal 80*b* and the second substrate connection terminal 70*b* are performed through welding (bonding section) with a different melting point from that of the solder included in the first solder bonding portion 94*a* and the second solder bonding portion 94*b* described above. In the following descriptions, a portion where the second end portion of the first metal terminal 80*a* and the first substrate connection terminal 70*a* are bonded is referred to as a first weld bonding portion 92*a*, and a portion where the second end portion of the second metal terminal 80*b* and the second substrate connection terminal 70*b* are bonded is referred to as a second weld bonding portion 92*b*. The first weld bonding portion 92*a* and the second weld bonding portion 92*b* preferably maintain bonding states even in a temperature where the first solder bonding portion 94*a* and the second solder bonding portion 94*b* melts. In the first weld bonding portion 92*a* and the second weld bonding portion 92*b*, bonding is able to be performed by solder including SnSb with a relatively high melting point or a bonding material such as a conductive adhesive or the like, other than the welding. Additionally, the welding includes bonding which does not include the bonding material as well.

Each of the first solder bonding portion 94*a* and the second solder bonding portion 94*b* may be coated by a resin with a low melting point to cover at least a surface of the solder, for example. Additionally, each of the first metal terminal 80*a* and the second metal terminal 80*b* may be coated by a resin with a low melting point, for example. Rosin, polyolefin wax, PE wax, PP wax, or the like are able to be included as the resin of the coatings.

The ceramic electronic component 10 according to the present preferred embodiment includes the first metal terminal 80*a* in which, while maintaining the elastically deformed state, the first end portion thereof is bonded to the first outer electrode 60*a* by the solder, and the second end portion thereof is bonded to the first substrate connection terminal 70*a* through welding with a higher melting point than that of the solder; and the second metal terminal 80*b* in which, while maintaining the elastically deformed state, the first end portion thereof is bonded to the second outer electrode 60*b* by the solder, and the second end portion thereof is bonded to the second substrate connection terminal 70*b* through welding with a higher melting point than that of the solder. When the ceramic electronic component 10 fails, the solder included as the first solder bonding portion 94*a* and the second solder bonding portion 94*b* melts by sensing heat generated by the electronic component main body 20. At this time, because the solder is able to directly sense the heat generated by the electronic component main body 20, even in the case where a large overcurrent does not flow when being included in a high-frequency AC circuit, or the like, for example, the abnormal heat generated by the electronic component main body 20 caused by a ripple current flowing in the faulty electronic component main body 20 is able to be detected with high sensitivity. The bonding of any one of the first metal terminal 80*a* and the second metal terminal 80*b* is detached, thus opening a circuit in which the ceramic electronic component 10 is incorporated. Accordingly, it is not necessary for the metal terminal maintaining the elastically deformed state to be included as both the first metal terminal 80*a* and the second metal terminal 80*b*. However, both the bonding of the first metal terminal 80*a* and the bonding of the second metal terminal 80*b* are detached, thus significantly reducing or preventing detection delay which may occur in the case where a location of the abnormal heat generation caused by the failure is biased to either, and a distance between the first end surface 36*a* and the second end surface 36*b* of the electronic component main body 20 is large. Additionally, each of the first substrate connection terminal 70*a* and the second substrate connection terminal 70*b* and the first metal terminal 80*a* and the second metal terminal 80*b* is directly bonded to and located on the electronic component main body 20, and thus space saving is able to be provided when mounting. As described above, the ceramic electronic component 10 according to the present preferred embodiment is able to reliably open a circuit at the failure, and prevent abnormal heat generation and an accident such as smoking, fire, or the like caused by the abnormal heat generation without lowering performance thereof.

Additionally, in the ceramic electronic component 10 according to the present preferred embodiment, each of the first solder bonding portion 94*a* where the first end portion of the first metal terminal 80*a* and the first outer electrode 60*a* are bonded, and the second solder bonding portion 94*b* where the first end portion of the second metal terminal 80*b* and the second outer electrode 60*b* are bonded is coated by a resin with a low melting point to cover at least the surface of the solder included in the bonding. Thus, the ceramic electronic component 10 according to the present preferred embodiment is able to significantly reduce or prevent occurrence of solder cracks caused by a thermal shock cycle or a high temperature environment.

Furthermore, in the ceramic electronic component 10 according to the present preferred embodiment, each of the first metal terminal 80*a* and the second metal terminal 80*b* is coated by a resin with a low melting point. Thus, stress concentration in the elastically deformed first metal terminal 80*a* on the first solder bonding portion 94*a* and stress concentration in the elastically deformed second metal terminal 80*b* on the second solder bonding portion 94*b* are able to be significantly reduced. As a result, the ceramic electronic component 10 according to the present preferred embodiment is able to prevent the first solder bonding portion 94*a* and the second solder bonding portion 94*b* from breaking in a normal state.

In the ceramic electronic component 10 according to the present preferred embodiment, the second end portion of the first metal terminal 80*a* and the first substrate connection terminal 70*a* are bonded through welding, and the second end portion of the second metal terminal 80*b* and the second substrate connection terminal 70*b* are bonded through welding. Thus, breaking of the bonding of the bonding portion (first weld bonding portion 92*a* and second weld bonding portion 92*b*) is able to be significantly reduced or prevented, even when an overcurrent flows due to the failure of the electronic component main body 20, for example, as well as when a normal current flows. Furthermore, because the bonding between the first metal terminal 80*a* and the first substrate connection terminal 70*a* is performed while the second end portion of the first metal terminal 80*a* being pressed to the surface of the first substrate connection terminal 70a, the operation bonding the first metal terminal 80a is able to be easily performed, while maintaining the elastically deformed state. Similar features are provided by the bonding between the second metal terminal 80b and the second substrate connection terminal 70b, and thus descriptions will not be repeated here.

The ceramic electronic component 10 according to the present preferred embodiment is able to control detection temperature by appropriately by Sn based solder with various melting points at the first solder bonding portion 94a and the second solder bonding portion 94b.

Modifications of First Preferred Embodiment

Figure 5:
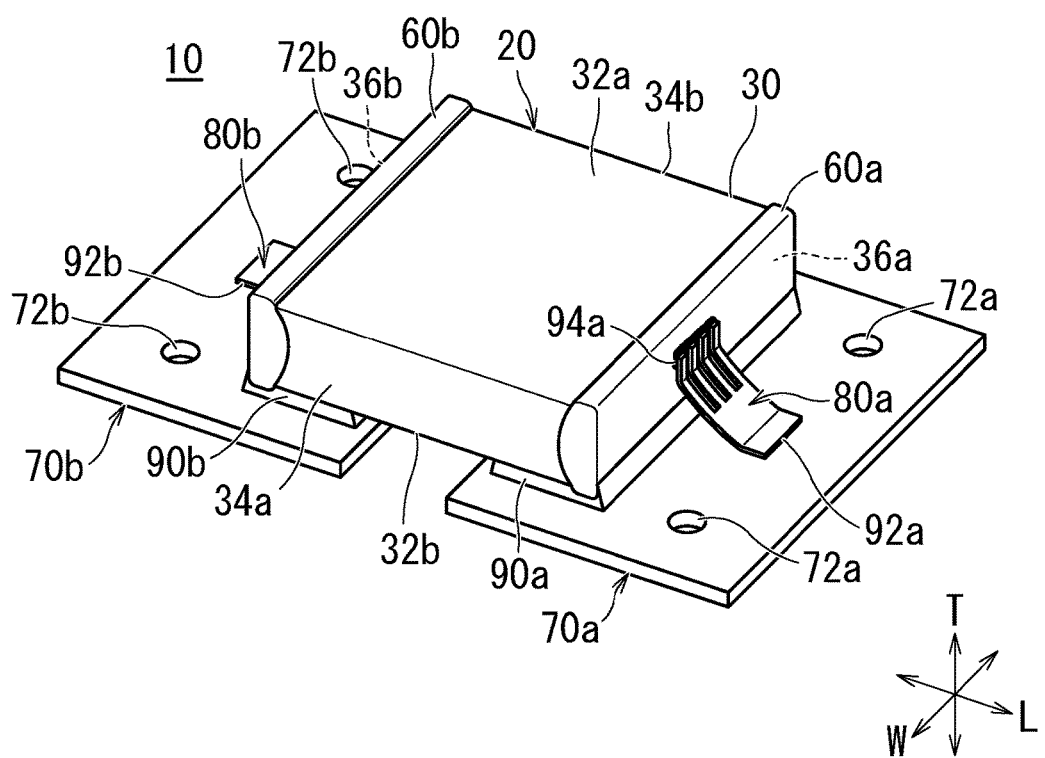
FIG. 5 is an external perspective view of a modification in which a first metal terminal and a second metal terminal of the ceramic electronic component according to the first preferred embodiment of the present invention each have a comb or substantially comb body shape.
Figure 6:
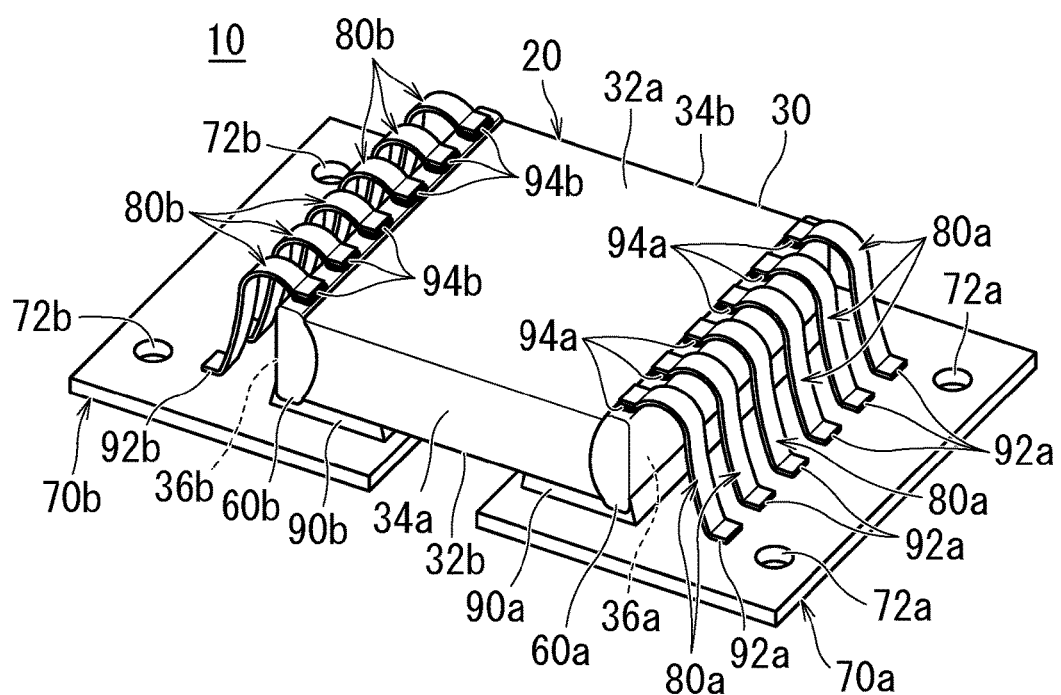
FIG. 6 is an external perspective view of a modification in which the first metal terminal and the second metal terminal of the ceramic electronic component according to the first preferred embodiment of the present invention each includes a plurality of ribbons.
Figure 6:
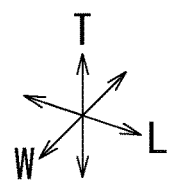

Hereinafter, a modification on the ceramic electronic component according to the first preferred embodiment of the present invention will be described with reference to FIG. 5 and FIG. 6. FIG. 5 is an external perspective view of a modification in which each of the first metal terminal and the second metal terminal of the ceramic electronic component according to the first preferred embodiment of the present invention has a comb or substantially comb body shape. FIG. 6 is an external perspective view of a modification in which each of the first metal terminal and the second metal terminal of the ceramic electronic component according to the first preferred embodiment of the present invention includes a plurality of ribbons. Modifications described below are the same as or similar to the ceramic electronic component 10 according to the first preferred embodiment described above excluding the first metal terminal 80a and the second metal terminal 80b. Accordingly, the same or similar elements will be given the same reference numerals, the same descriptions will not be repeated.

The first metal terminal 80a may include, for example, a comb or substantially comb body shape including a plurality of comb-tooth portions located on a first end portion side thereof (that is, the end portion side connected to the first outer electrode 60a), and a comb main body portion located on the second end portion side thereof (that is, the end portion side connected to the first substrate connection terminal 70a). The second metal terminal 80b may include, for example, a comb or substantially comb body shape including a plurality of comb-tooth portions located on a first end portion side thereof (that is, the end portion side connected to the second outer electrode 60b), and a comb main body portion located on the second end portion side thereof (that is, the end portion side connected to the second substrate connection terminal 70b). The ceramic electronic component 10 includes the first metal terminal 80a and the second metal terminal 80b including a comb or substantially comb body shape, which significantly reduces or prevents thermal stress caused by a difference in coefficients of linear expansion between the electronic component main body 20 and each of the first substrate connection terminal 70a and the second substrate connection terminal 70b. In particular, the effect is remarkably exhibited, when the ceramic electronic component 10 is large. The significant reduction or prevention of thermal stress as described above provides a significant reduction or prevention of breaking of the ceramic electronic component 10 in a thermal shock cycle or the like.

Each of the first metal terminal 80a and the second metal terminal 80b may include a plurality of terminals, for example. In this case, each of the first metal terminal 80a and the second metal terminal 80b may include a plurality of lead wires covered by an insulator, or may include a plurality of ribbons, for example. Here, the ribbon includes a first end portion which is bonded to a portion of the first outer electrode 60a or the second outer electrode 60b located on the first main surface 32a of the multilayer body 30; a main body portion which bends from an outer side portion end edge of the first end portion, extends upward or substantially upward while extending outward to separate from the electronic component main body 20, curves smoothly therefrom, and extends substantially downward while extending outward to separate from the electronic component main body 20; and the second end portion which bends from an outer side portion end edge of the main body portion and is bonded to the surface of the first substrate connection terminal 70a or the second substrate connection terminal 70b. By including the first metal terminal 80a and the second metal terminal 80b as described above, the ceramic electronic component 10 provides the similar effects and features as the case where each of the first metal terminal 80a and the second metal terminal 80b includes a comb or substantially comb body shape described above.

Each of the first metal terminal 80a and the second metal terminal 80b may include, for example, a plurality of terminals including a shape described in the first preferred embodiment (FIG. 1 to FIG. 4), a plurality of terminals including a comb or substantially comb body shape, or a plurality of conducting wires other than a lead wire covered by an insulator (for example, a plurality of exposed metal wires or the like).

Although the first preferred embodiment describes a case that the melting point of the bonding section included to bond the second end portion of the first metal terminal 80a and the first substrate connection terminal 70a is higher than that of the bonding material included to bond the first end portion of the first metal terminal 80a and the first outer electrode 60a or in a case of the coating, this may be reversed, for example. In this case, when an overcurrent flows by failure, for example, the ceramic electronic component 10 is able to open a circuit by breaking the bonding between the second end portion of the first metal terminal 80a and the first substrate connection terminal 70a.

An example of a method for manufacturing a ceramic electronic component according to a preferred embodiment of the present invention will be described with respect to the ceramic electronic component described above as an example.

First, the electronic component main body including the multilayer body preferably with a rectangular parallelepiped or substantially rectangular parallelepiped shape preferably formed by alternately laminating the plurality of ceramic layers and the plurality of inner electrode layers, and the first outer electrode and the second outer electrode located on the surface of the multilayer body is manufactured. The specific method will be described below.

First, ceramic paste including ceramic powder and conductive paste that form the inner electrode are prepared.

Next, the ceramic paste is, for example, applied in a substantially sheet shape by a screen printing method or the like and dried to manufacture a ceramic green sheet.

Additionally, on a surface of the manufactured ceramic green sheet, the conductive paste that defines the inner electrode is applied in a predetermined pattern through, for example, the screen printing method or the like to prepare a ceramic green sheet on which an inner electrode pattern is formed. Additionally, a ceramic green sheet on which the inner electrode pattern is not formed is also prepared. The ceramic green sheet or the conductive paste for the inner electrode may include, for example, a binder or solvent.

Furthermore, the predetermined number of ceramic green sheets on which the inner electrode pattern is not formed are laminated, the predetermined number of ceramic sheets on which the inner electrode pattern is formed are laminated on a surface thereof, and the predetermined number of ceramic green sheets on which the inner electrode pattern is not formed are laminated on a surface thereof, to manufacture a mother multilayer body.

The mother multilayer body may be pressed in a lamination direction as desired. As a method for pressing, an isostatic press or the like is able to be used, for example.

Then, the mother multilayer body is cut into a predetermined size to manufacture a plurality of raw multilayer bodies. At this time, by performing barrel polishing, corner portions and ridge line portions of the raw multilayer body may be rounded, for example.

Next, the raw multilayer body is fired to manufacture the multilayer body in which the first inner electrode layers and the second inner electrode layers are located, the end portions of the first inner electrode layers are extended to the first end surface thereof, and the end portions of the second inner electrode layers are extended to the second end surface thereof. The firing temperature at this time is able to be, for example, not lower than about 900° C. and not higher than about 1300° C. The firing temperature is not limited thereto, and may be appropriately set in accordance with a ceramic material and a conductive material that are included.

Additionally, conductive paste that forms the outer electrode is applied to at least each of the first end surface and the second end surface of the fired multilayer body and baked to form the base electrode layer of each of the first outer electrode and the second outer electrode. The baking temperature at this time is preferably not lower than about 700° C. and not higher than about 900° C., for example.

Furthermore, a plating layer may be located on a surface of the base electrode layer as desired, for example.

As described above, the electronic component main body is able to be manufactured.

Subsequently, a procedure through which the first metal terminal and the second metal terminal, and the first substrate connection terminal and the second substrate connection terminal are bonded to the electronic component main body to complete the ceramic electronic component according to the first preferred embodiment of the present invention will be described.

First, the electronic component main body manufactured through the above-described procedure, and the first metal terminal and the second metal terminal and the first substrate connection terminal and the second substrate connection terminal are prepared.

Next, the first end portion of the first metal terminal is bonded to a portion of the first outer electrode of the electronic component main body located on the first end surface of the multilayer body by solder. The first end portion of the second metal terminal is bonded to a portion of the second outer electrode of the electronic component main body located on the second end surface of the multilayer body by solder.

Additionally, the first substrate connection terminal is bonded to at least one of the first outer electrode and the multilayer body by a bonding material that electrically insulates the first substrate connection terminal from the first outer electrode. The second substrate connection terminal is bonded to at least one of the second outer electrode and the multilayer body by a bonding material that electrically insulates the second substrate connection terminal from the second outer electrode.

Finally, an external force in a direction toward the first outer electrode is applied to the second end portion of the first metal terminal to elastically deform the first metal terminal, and while maintaining this state, the second end portion of the first metal terminal and the first substrate connection terminal are bonded through welding. An external force in a direction toward the second outer electrode is applied to the second end portion of the second metal terminal to elastically deform the second metal terminal, and while maintaining this state, the second end portion of the second metal terminal and the second substrate connection terminal are bonded through welding.

As described above, the ceramic electronic component according to the first preferred embodiment of the present invention is able to be manufactured.

Figure 7:
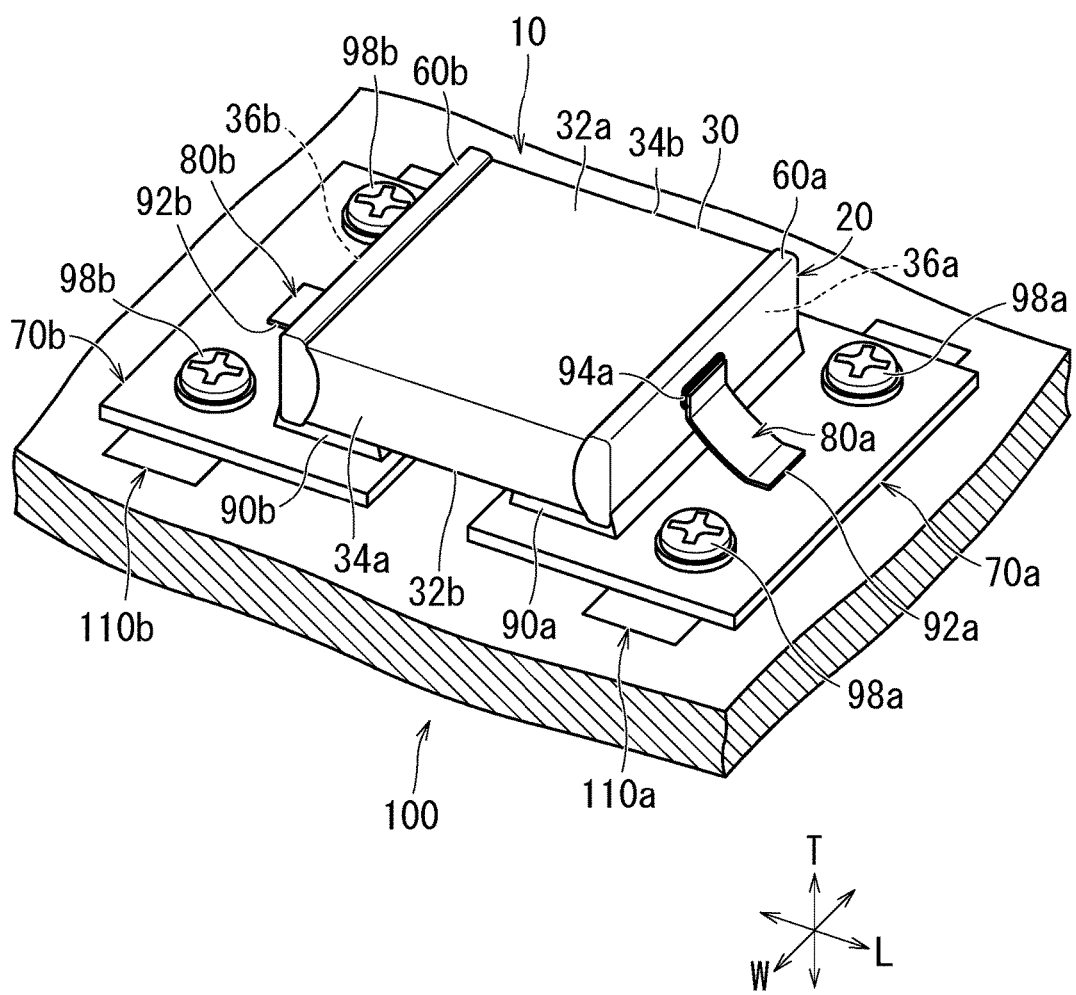
FIG. 7 is an external perspective view showing a mounting structure of the ceramic electronic component according to the first preferred embodiment of the present invention.

Hereinafter, a mounting structure of a ceramic electronic component according to the first preferred embodiment of the present invention will be described with reference to FIG. 7. FIG. 7 is an external perspective view showing the mounting structure of the ceramic electronic component according to the first preferred embodiment of the present invention. The mounting structure of the ceramic electronic component according to the present preferred embodiment is a structure that the ceramic electronic component 10 according to the first preferred embodiment described above is mounted on a mounting substrate 100. Accordingly, the same or similar elements will be given the same reference numerals, the same descriptions as those for the ceramic electronic component 10 will not be repeated.

The mounting structure of the ceramic electronic component 10 according to the present preferred embodiment includes the ceramic electronic component 10 described above, the mounting substrate 100 on which the ceramic electronic component 10 is mounted, and a first screw member 98a and a second screw member 98b to fix the ceramic electronic component 10 to the mounting substrate 100.

The mounting substrate 100 includes a first land portion 110a and a second land portion 110b.

The first screw member 98a is inserted through the first screw hole 72a bored in the first substrate connection terminal 70a and screwed to the mounting substrate 100. Thus, the first substrate connection terminal 70a is, in a state of being electrically connected, fixed to the first land portion 110a. The second screw member 98b is inserted through the second screw hole 72b bored in the second substrate connection terminal 70b and screwed to the mounting substrate 100. Thus, the second substrate connection terminal 70b is, in a state of being electrically connected, fixed to the second land portion 110b.

The mounting structure of the ceramic electronic component according to the present preferred embodiment includes the first screw hole 72a bored in the first substrate connection terminal 70a in advance, and the second screw hole 72b bored in the second substrate connection terminal 70b in advance. The mounting operation is able to be easily performed.

The first screw hole 72a and the second screw hole 72b need not be bored in advance. In this case, for example, in a process of performing screwing operation, the first screw member 98a bores a portion of the first substrate connection terminal 70a and reaches the mounting substrate 100, and the second screw member 98b bores a portion of the second substrate connection terminal 70b and reaches the mounting substrate 100. The ceramic electronic component 10 may be fixed to the mounting substrate 100, for example. A screw hole is defined in the mounting substrate 100 in advance, and a screw corresponding thereto may be used, or a tapping screw may be included with respect to the first screw member 98a and the second screw member 98b, for example.

Figure 8:
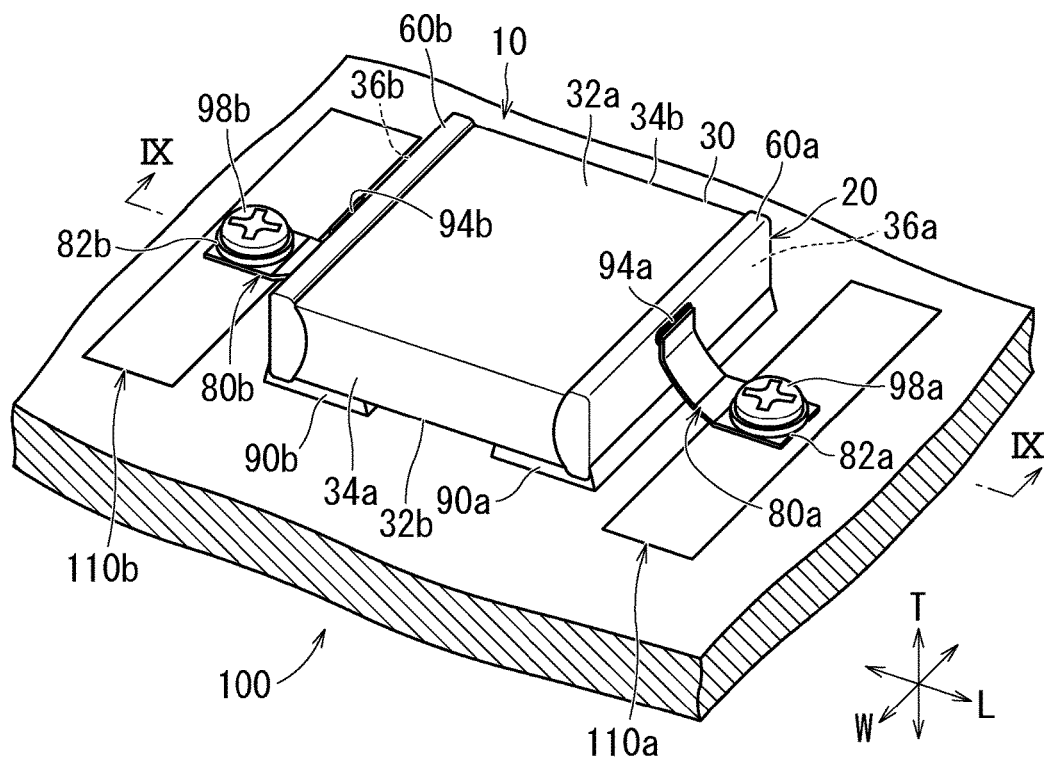
FIG. 8 is an external perspective view showing a mounting structure of a ceramic electronic component according to a second preferred embodiment of the present invention.
Figure 9:
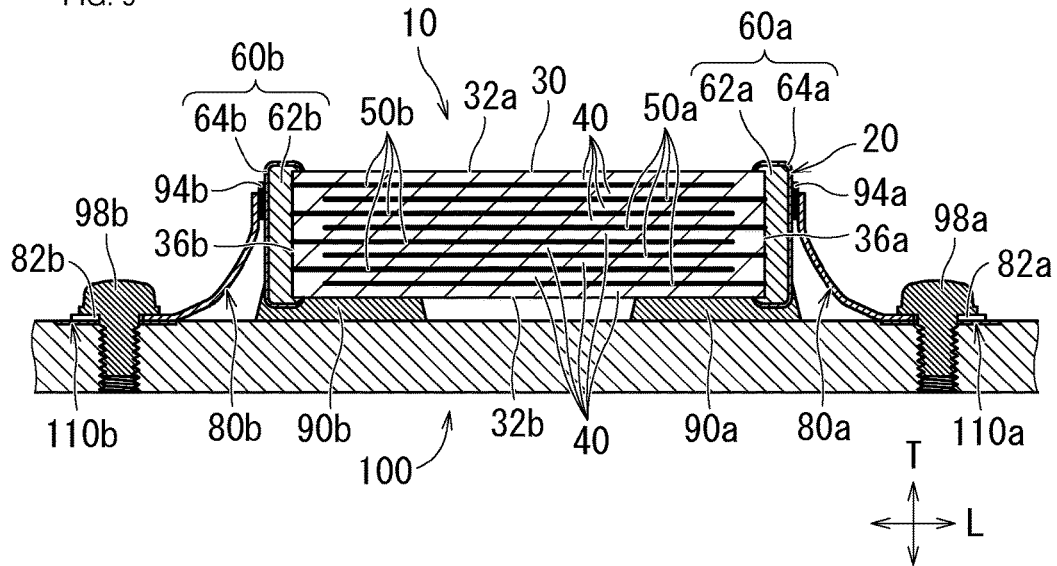
FIG. 9 is a cross-sectional view of the mounting structure of the ceramic electronic component according to the second preferred embodiment of the present invention taken along a length direction.
Figure 10:
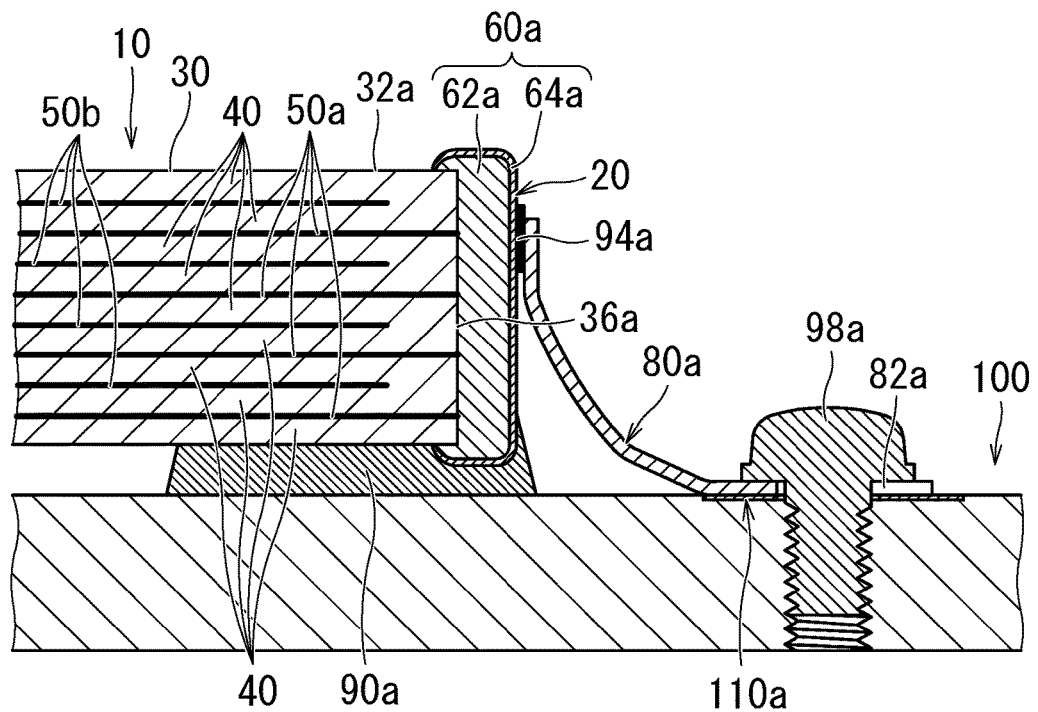
FIG. 10 is a cross-sectional view showing a normal state of the mounting structure of the ceramic electronic component according to the second preferred embodiment of the present invention taken along the length direction and adjacent to or in a vicinity of the first outer electrode.
Figure 11:
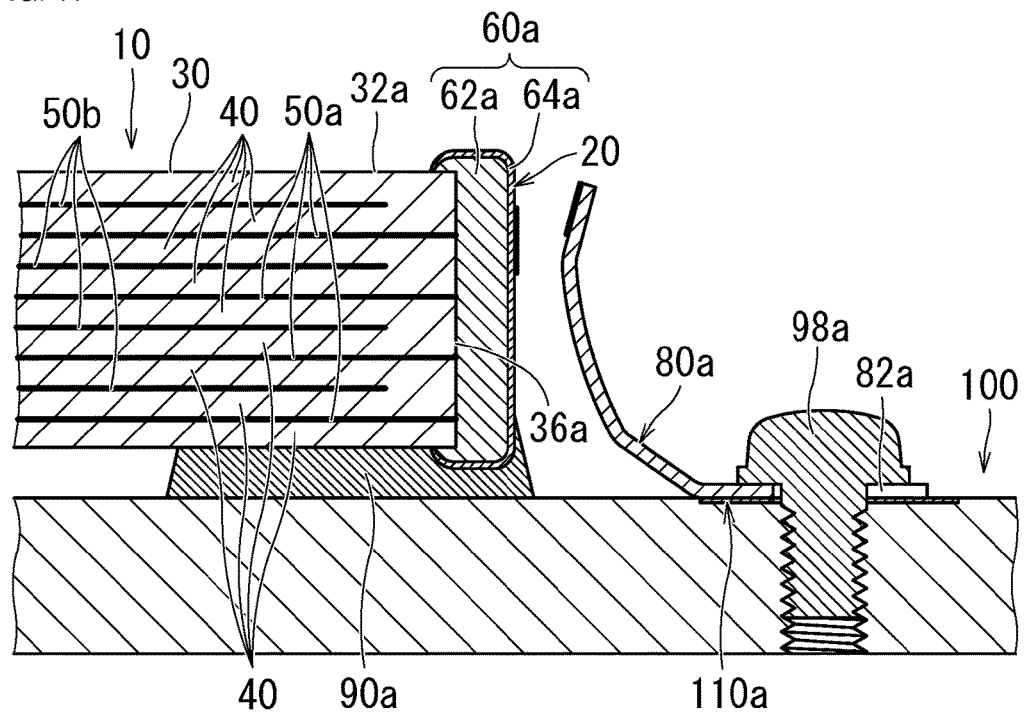
FIG. 11 is a cross-sectional view showing a state where an electrical connection of the mounting structure of the ceramic electronic component according to the second preferred embodiment of the present invention is cut off taken along the length direction and adjacent to or in a vicinity of the first outer electrode.

Hereinafter, a mounting structure of a ceramic electronic component according to a second preferred embodiment of the present invention will be described with reference to FIGS. 8 to 11. FIG. 8 is an external perspective view showing the mounting structure of the ceramic electronic component according to the second preferred embodiment of the present invention. FIG. 9 is a cross-sectional view of the mounting structure of the ceramic electronic component according to the second preferred embodiment of the present invention taken along a length direction. FIG. 10 is a cross-sectional view showing a normal state of the mounting structure of the ceramic electronic component according to the second preferred embodiment of the present invention taken along the length direction and adjacent to or in a vicinity of the first outer electrode. FIG. 11 is a cross-sectional view showing a state where an electrical connection of the mounting structure of the ceramic electronic component according to the second preferred embodiment of the present invention is cut off taken along the length direction and adjacent to or in a vicinity of the first outer electrode. The mounting structure of the ceramic electronic component according to the present preferred embodiment is the same as or similar to the mounting structure of the ceramic electronic component according to the first preferred embodiment described above, excluding the first substrate connection terminal 70a and the second substrate connection terminal 70b and the first metal terminal 80a and the second metal terminal 80b. Accordingly, the same or similar elements will be given the same reference numerals, the same descriptions will not be repeated.

The mounting structure of the ceramic electronic component according to the present preferred embodiment does not include the first substrate connection terminal 70a and the second substrate connection terminal 70b, in contrast to the mounting structure of the ceramic electronic component according to the first preferred embodiment described above. The second end portion of the first metal terminal 80a (that is, the end portion on the mounting substrate 100 side) preferably has a substantially branched Y shape defined by a first cutout 82a through which the first screw member 98a is inserted being provided therein. The second end portion of the second metal terminal 80b (that is, the end portion on the mounting substrate 100 side) preferably has a substantially branched Y shape defined by a second cutout 82b through which the second screw member 98b is inserted being provided therein.

The mounting substrate 100 includes the first land portion 110a and the second land portion 110b. The first metal terminal 80a is, in a state of being electrically connected, fixed to the first land portion 110a by the first screw member 98a passing through the first cutout 82a thereof and screwed to the mounting substrate 100. The second metal terminal 80b is, in a state of being electrically connected, fixed to the second land portion 110b by the second screw member 98b passing through the second cutout 82b thereof and screwed to the mounting substrate 100. The fixed portion corresponds to the first weld bonding portion 92a and the second weld bonding portion 92b in the mounting structure of the ceramic electronic component according to the first preferred embodiment described above. The mounting substrate 100 is bonded to at least one of the first outer electrode 60a and the multilayer body 30 by a bonding material that is electrically insulating, and bonded to at least one of the second outer electrode 60b and the multilayer body 30 by the bonding material that is electrically insulating. The bonding portions correspond to the first insulation bonding portion 90a and the second insulation bonding portion 90b in the mounting structure of the ceramic electronic component according to the first preferred embodiment described above.

The mounting structure of the ceramic electronic component according to the present preferred embodiment does not include the first substrate connection terminal 70a and the second substrate connection terminal 70b, includes fewer components or elements than the mounting structure of the ceramic electronic component according to the first preferred embodiment described above, and thus a significant reduction in size and height is achieved.

Figure 12:
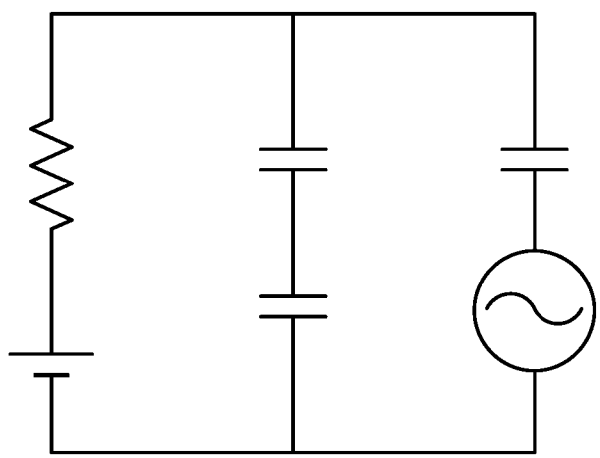
FIG. 12 is a circuit diagram of an experimental example 1, an experimental example 2, and a comparative experimental example 1 that confirm effects and features of the ceramic electronic component according to preferred embodiments of the present invention.
Figure 13:
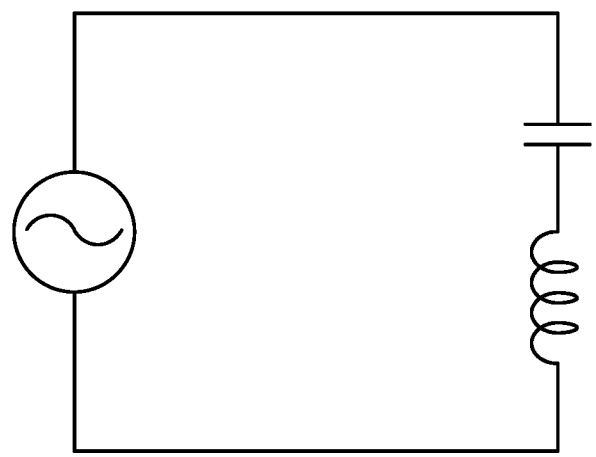
FIG. 13 is a circuit diagram of an experimental example 2, and an experimental example 3 that confirm effects and features of the ceramic electronic component according to preferred embodiments of the present invention.
Figure 14A:
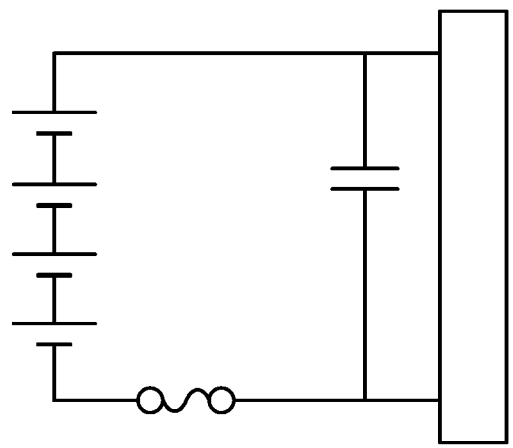
FIGS. 14A to 14C are circuit diagrams for explaining a ceramic electronic component of the Related Art.
Figure 14B:
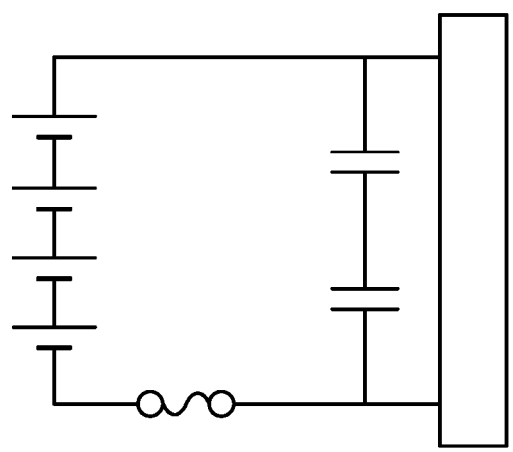
Figure 14C:
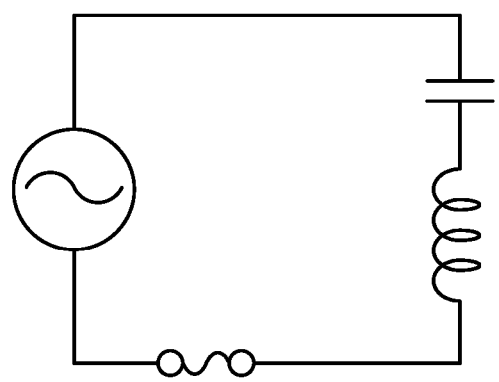

Hereinafter, in order to confirm advantageous effects and features of the preferred embodiments of the present invention, experimental examples will be described. FIG. 12 is a circuit diagram of an experimental example 1, an experimental example 2, and a comparative experimental example 1 that confirm the advantageous effects and features of the ceramic electronic components according to the preferred embodiments of the present invention, and a case where two ceramic electronic components connected in series to span across PN of DC line are included. The two capacitors in the center in the diagram connected in series are ceramic electronic components (multilayer ceramic capacitors) to be tested. DC voltage is applied to the multilayer ceramic capacitors to be tested from a circuit connected on the left side, and ripple voltage is applied to the multilayer ceramic capacitors to be tested from a circuit connected on the right side. FIG. 13 is a circuit diagram of an experimental example 3 that confirms the effects and features of the ceramic electronic components according to the preferred embodiments of the present invention, an LC resonance load is applied to the multilayer ceramic capacitor to be tested located on upper right in the diagram. DC voltage is applied to the multilayer ceramic capacitor to be tested by a circuit connected on the left side, and ripple voltage is applied to the multilayer ceramic capacitor to be tested from a circuit connected on the right side.

EXPERIMENTAL EXAMPLE 1

In the experimental example 1, a circuit with multilayer ceramic capacitors as the ceramic electronic components according to the preferred embodiments of the present invention connected in series, as shown in FIG. 12, was manufactured, a fail-safe function of the multilayer ceramic capacitors were evaluated. One of the two multilayer ceramic capacitors connected in series was mounted on the substrate, after being subjected to dielectric breakdown by a dielectric breakdown voltage testing machine, in order to reproduce a failure state. Additionally, the capacitor connected on the right side in the circuit in FIG. 12 included a breakdown voltage of about 2 kV, and electrostatic capacitance of about 500 µF.

WORKING EXAMPLE 1

In accordance with the manufacturing method described above, a sample (multilayer ceramic capacitor) for a working example 1 was manufactured. Specifications of the working example 1 and a fixing method between the substrate connection terminal and the mounting substrate were as follows.

Chip size (L×W×T): 16 mm×20 mm×3.7 mm (design value)
Ceramic layer: BaTiO$_3$
Inner electrode layer: Ni
Structure of outer electrode
    Base electrode layer: Cu
    Plating layer: none
Structure of metal terminal
    C7035TM04 made by DOWA OLIN
    Quantity: 2 in total (only one pair)
    Shape of end portion on substrate connection terminal side (the second end portion): substantially Y shape
    Thickness: 0.1 mm
Bonding material bonding outer electrode and metal terminal: M705 made by Senju Metal Industry
Bonding material bonding outer electrode and substrate connection terminal: silicone based adhesive KE-1830 made by Shin-Etsu Silicone
Bonding method between substrate connection terminal and metal terminal: welding
Fixing method between substrate connection terminal and mounting substrate: screwing
Voltage Application Condition
In the experimental example 1, by applying voltage to the circuit in FIG. 12 under the following conditions, a fail-safe function of the working example 1 was evaluated.
    Applied voltage: DC 400 V
    Superimposed voltage: AC 15 kHz, Vp-p=56V
    Electrostatic capacitance (per one multilayer ceramic capacitor): 15 µF (combined capacitance of two in series 7.5 µF)
Result of Experimental Example 1

In the experimental conditions described above, DC voltage was applied and no abnormality was confirmed at this stage. Next, AC voltage was applied to supply an AC current to the working example 1 (multilayer ceramic capacitor). When four minutes had passed from an AC voltage application start, and the temperature of the working example 1 which was subjected to dielectric breakdown in advance reached about 240° C., it was confirmed that the solder bonding the outer electrode and the metal terminal melted, and an electrical connection was cut off. At this time, smoking and fire did not occur in the working example 1. During the experiment, the circuit also did not short-circuit. As described above, the ceramic electronic components according to the preferred embodiments of the present invention are able to reasonably cut off the electrical connection, even if an overcurrent flows in a circuit with two or more of the ceramic electronic components connected in series by failure or the like, by solder included to bond the outer electrode and the metal terminal directly sensing heat generated in the electronic component main body. As a result, the ceramic electronic components according to the preferred embodiments of the present invention are able to reliably open the circuit when failing, thus significantly reducing or preventing smoking and fire. Additionally, the solder is able to also sense heat generation in the electronic component main body caused by the ripple current flowing in the circuit with high sensitivity, and thus smoking and fire caused by the heat generation are able to be significantly reduced or prevented.

COMPARATIVE EXPERIMENTAL EXAMPLE 1

In the comparative experimental example 1, a circuit with the multilayer ceramic capacitors as a comparative example 1 of the ceramic electronic component according to a preferred embodiment of the present invention connected in series similar to the experimental example 1, as shown in FIG. 12, was manufactured, a fail-safe function of the multilayer ceramic capacitors was evaluated. One of the two multilayer ceramic capacitors connected in series was mounted on a substrate, after being subjected to dielectric breakdown by a dielectric breakdown voltage testing machine, in order to reproduce a failure state. Although, for safety, equipment used for this experiment includes a mechanism to automatically turn off power when measurement temperature exceeds about 400° C., the other experimental method is the same as or similar to that in the experimental example 1 described above.

COMPARATIVE EXAMPLE 1

With respect to the electronic component main body manufactured in accordance with the manufacturing method described above, a sample (multilayer ceramic capacitor) of the comparative example 1 was manufactured. Although the comparative example 1 included the same or a similar electronic component main body as that in the working example 1 described above, the structure with a pair of metal terminals did not have elasticity, in contrast to the working example 1, and a pair of substrate connection terminals was not included. Specifications and a fixing method between the metal terminal and the mounting substrate of the comparative example 1 were as follows.
Chip size (L×W×T): 16 mm×20 mm×3.7 mm (design value)
Ceramic layer: BaTiO$_3$
Inner electrode layer: Ni
Structure of outer electrode
    Base electrode layer: Cu
    Plating layer: none
Structure of metal terminal
    Beryllium copper
    Quantity: two in total (only one pair)
    Shape of metal terminal: comb body shape as shown in FIG. 5 (that is, a shape in which each of the pair of the metal terminals includes four comb-tooth portions on the outer electrode side, and the comb main body portion is directly bonded to the mounting substrate)
    Thickness: 0.2 mm
Bonding method between outer electrode and metal terminal: baking at temperature of 700° C. with composite paste of copper and glass as bonding material
Fixing method between metal terminal and mounting substrate: reflow mounting by M705 solder
Voltage Application Condition
In the comparative experiment, by applying voltage to the circuit in FIG. 12 under the following conditions, behavior without the fail-safe function of the preferred embodiments of the present invention was confirmed.
    Applied voltage: DC 400 V
    Superimposed voltage: AC 15 kHz, Vp-p=56V
    Electrostatic capacitance (per one multilayer ceramic capacitor): 15 µF (combined capacitance of two in series 7.5 µF)
Result of Comparative Experimental Example 1

Under the experimental conditions described above, DC voltage was applied, and no abnormality was confirmed at this stage. Next, AC voltage was applied to supply an AC current to the comparative example 1 (multilayer ceramic capacitor) to be tested. When one minute had passed from AC voltage application start, the temperature of the comparative example 1 which was subjected to dielectric breakdown in advance reached about 500° C., and therefore AC voltage application was stopped by the safety apparatus described above. During the experiment, the circuit did not short-circuit. When the comparative example 1 to be tested was detached from the substrate after the experiment and the state thereof was confirmed, a state where the comparative example 1 subjected to dielectric breakdown in advance and a portion of the mounting substrate on which the comparative example 1 was mounted were burned black was confirmed. From the above-described result, even if the two comparative examples 1 (multilayer ceramic capacitors) are connected in series, and short-circuit caused by failure of one comparative example 1 of one of the multilayer ceramic capacitors is prevented, it was confirmed that there was a risk of the comparative example 1 failing due to an application of an AC current generating abnormal heat, and smoking and fire would occur.

EXPERIMENTAL EXAMPLE 2

In accordance with the manufacturing method described above with respect to the preferred embodiments of the present invention, a sample (multilayer ceramic capacitor) for a working example 2 was manufactured. The working example 2 included the same or a similar structure as that of the working example 1 excluding the substrate connection terminal being not included. Additionally, the second end portion of the metal terminal was directly connected to the land portion of the mounting substrate. Specifications of the working example 2 were as follows.
  Chip size (L×W×T): 16 mm×20 mm×3.7 mm (design value)
  Ceramic layer: $BaTiO_3$
  Inner electrode layer: Ni
  Structure of outer electrode
    Base electrode layer: Cu
    Plating layer: none
  Structure of metal terminal
    C7035TM04 made by DOWA OLIN
    Quantity: two in total (only one pair)
    Shape of end portion on mounting substrate side (the second end portion): substantially Y shape
    Thickness: 0.1 mm
  Bonding material bonding outer electrode and metal terminal: M705 made by Senju Metal Industry
  Bonding material bonding outer electrode and multilayer body and mounting substrate: silicone based adhesive KE-1830 made by Shin-Etsu Silicone
  Fixing method between metal terminal and mounting substrate: screwing
Voltage Application Condition
  In the experimental example 2, by applying voltage to the circuit in FIG. 13 under the following conditions, a fail-safe function of the working example 2 was evaluated.
    Applied voltage: DC 400 V
    Superimposed voltage: AC 15 kHz, Vp-p=56V
    Electrostatic capacitance (per one multilayer ceramic capacitor): 15 µF (combined capacitance of two in series 7.5 µF)
Result of Experimental Example 2
  After starting voltage application under the conditions described above, when two minutes had elapsed and temperature reached about 238° C., it was confirmed that the solder bonding the outer electrode and the metal terminal melted and the electrical connection was cut off. At this time, smoking and fire did not arise in the working example 2. As described above, the ceramic electronic components according to the preferred embodiments of the present invention are able to reasonably cut off the electrical connection, even if an overcurrent flows in a circuit with two or more electronic components connected in series by failure or the like, by solder included to bond the outer electrode and the metal terminal directly sensing heat generated in the electronic component main body. As a result, the ceramic electronic components according to the preferred embodiments of the present invention are able to reliably open a circuit when failing, and thus smoking and fire are able to be significantly reduced or prevented. Additionally, the solder is able to also sense heat generation in the electronic component main body caused by the ripple current flowing in the circuit with high sensitivity, and thus smoking and fire caused by the heat generation are able to be significantly reduced or prevented.

EXPERIMENTAL EXAMPLE 3

In accordance with the manufacturing method described above with respect to the preferred embodiments of the present invention, a sample (multilayer ceramic capacitor) for a working example 3 was manufactured. The working example 3 included the same or a similar structure as in the working example 1 except that the substrate connection terminal was not included and a total of four metal terminals (two pairs) were included. Additionally, the second end portion of the metal terminal was directly connected to the land portion of the mounting substrate. Specifications of the working example 3 were as follows.
  Chip size (L×W×T): 16 mm×20 mm×3.7 mm (design value)
  Ceramic layer: $Ca(Zr, Ti)O_3$
  Inner electrode layer: Ni
  Structure of outer electrode
    Base electrode layer: Cu
    Plating layer: none
  Structure of metal terminal
    C7035TM04 made by DOWA OLIN
    Quantity: four in total (two pairs)
    Shape of end portion on mounting substrate side (the second end portion): substantially Y shape
    Thickness: 0.1 mm
  Bonding material bonding outer electrode and metal terminal: M705 made by Senju Metal Industry
  Bonding material bonding outer electrode and multilayer body and mounting substrate: silicone based adhesive KE-1830 made by Shin-Etsu Silicone
  Fixing method between metal terminal and mounting substrate: screwing
Voltage Application Condition
  In the experimental example 3, by applying AC voltage to the circuit in FIG. 13 under the following conditions, a fail-safe function of the working example 3 was evaluated.
    Applied voltage: AC 24 kHz, 800 Vp-p
    Electrostatic capacitance of multilayer ceramic capacitor: 1.2 µF
Result of Experimental Example 3
  After starting voltage application under the conditions described above, when one minute had elapsed and the temperature reached about 240° C., it was confirmed that the solder bonding the outer electrode and the metal terminal melted, and the electrical connection was cut off. At this time, smoking and fire did not arise in the working example 3. As described above, the ceramic electronic components according to the preferred embodiments of the present invention are able to reasonably cut off the electrical connection, even if an overcurrent flows in a circuit in which two or more electronic components are connected in series and only an AC current by LC resonance flows by failure or the like, by solder included to bond the outer electrode and the metal terminal directly sensing heat generated in the electronic component main body. As a result, the ceramic electronic components according to the preferred embodiments of the present invention are able to reliably open the circuit when failing, thus significantly reducing or preventing smoking and fire. Additionally, the solder is able to also sense heat generation in the electronic component main body caused by the AC current flowing in the circuit with high sensitivity, and thus smoking and fire caused by the heat generation are able to be significantly reduced or prevented.

In the experimental example 1 and the experimental example 2 and the comparative experimental example 1, the time until the multilayer ceramic capacitor generates abnormal heat and reaches high temperature depends on the failure state of the multilayer ceramic capacitor. Accordingly, a length of the time until reaching the high temperature does not directly relate to the performance of the overheat preventing feature of the preferred embodiments of the present invention.

The present invention is not intended to be limited to the aforementioned preferred embodiments, many variations and modifications are able to be made thereon without departing from the essential scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   a multilayer body with a rectangular parallelepiped or rectangular parallelepiped shape and including a plurality of ceramic layers, a plurality of first inner electrode layers, and a plurality of second inner electrode layers, the multilayer body including a first main surface and a second main surface opposing each other in a lamination direction, a first side surface and a second side surface opposing each other in a width direction orthogonal or substantially orthogonal to the lamination direction, and a first end surface and a second end surface opposing each other in a length direction orthogonal or substantially orthogonal to the lamination direction and the width direction;
   a first outer electrode electrically connected to the plurality of first inner electrode layers and located on at least the first end surface of the multilayer body, and a second outer electrode electrically connected to the plurality of second inner electrode layers and located on at least the second end surface of the multilayer body;
   a first substrate connection terminal bonded to at least one of the first outer electrode and the multilayer body by a bonding material that electrically insulates the first substrate connection terminal from the first outer electrode, and a second substrate connection terminal bonded to at least one of the second outer electrode and the multilayer body by a bonding material that electrically insulates the second substrate connection terminal from the second outer electrode; and
   a first metal terminal electrically connecting the first outer electrode and the first substrate connection terminal, and a second metal terminal electrically connecting the second outer electrode and the second substrate connection terminal; wherein
   while the first metal terminal maintains an elastically deformed state, a first end portion of the first metal terminal is bonded to the first outer electrode by an electrically conductive bonding material and a second end portion of the first metal terminal is bonded to the first substrate connection terminal by a bonding section with a different melting point from a melting point of the electrically conductive bonding material; and
   while the second metal terminal maintains an elastically deformed state, a first end portion of the second metal terminal is bonded to the second outer electrode by an electrically conductive bonding material and a second end portion of the second metal terminal is bonded to the second substrate connection terminal by a bonding section with a different melting point from a melting point of the electrically conductive bonding material.

2. The ceramic electronic component according to claim 1, wherein a portion where the first end portion of the first metal terminal and the first outer electrode are bonded and a portion where the first end portion of the second metal terminal and the second outer electrode are bonded are each coated by a resin with a low melting point to cover at least a surface of the electrically conductive bonding material.

3. The ceramic electronic component according to claim 1, wherein each of the first metal terminal and the second metal terminal is coated by a resin with a low melting point.

4. The ceramic electronic component according to claim 1, wherein each of the first metal terminal and the second metal terminal includes a comb structure including a plurality of comb-tooth portions located on the first end portion side of each of the first metal terminal and the second metal terminal and a comb main portion located on the second end portion side of each of the first metal terminal and the second metal terminal.

5. The ceramic electronic component according to claim 1, wherein each of the first metal terminal and the second metal terminal includes a plurality of terminals.

6. A mounting structure of a ceramic electronic component comprising:
   the ceramic electronic component according to claim 1; and
   a mounting substrate on which the ceramic electronic component is mounted; wherein
   the first substrate connection terminal of the ceramic electronic component and a first land portion of the mounting substrate are electrically connected; and
   the second substrate connection terminal of the ceramic electronic component and a second land portion of the mounting substrate are electrically connected.

7. The mounting structure of the ceramic electronic component according to claim 6, further comprising:
   a first screw member to fix a state where the first substrate connection terminal of the ceramic electronic component and the first land portion of the mounting substrate are electrically connected; and
   a second screw member to fix a state where the second substrate connection terminal of the ceramic electronic component and the second land portion of the mounting substrate are electrically connected.

8. The ceramic electronic component according to claim 1, wherein each of the plurality of ceramic layers is located between one of the plurality of first inner electrode layers and one of the plurality of second inner electrode layers.

9. The ceramic electronic component according to claim 1, wherein the ceramic electronic component defines a capacitor, a piezoelectric component, a thermistor, or an inductor.

10. The ceramic electronic component according to claim 1, wherein
the first outer electrode includes a first base electrode layer located on the first end surface of the multilayer body and a first plating layer located on a surface of the first base electrode layer; and
the second outer electrode includes a second base electrode layer located on the second end surface of the multilayer body and a second plating layer located on a surface of the second base electrode layer.

11. The ceramic electronic component according to claim 10, wherein each of the first base electrode layer and the second baes electrode layer includes a conductive metal and glass.

12. The ceramic electronic component according to claim 10, wherein each of the first plating layer and the second plating layer includes a dual-layer structure.

13. The ceramic electronic component according to claim 12, wherein the dual-layer structure includes a Ni plating layer on the surface of the first base electrode layer or the second base electrode layer and an Si plating layer on the Ni plating layer.

14. The ceramic electronic component according to claim 1, wherein each of the first outer electrode and second outer electrode includes solder.

15. A mounting structure of a ceramic electronic component comprising:
a ceramic electronic component; and
a mounting substrate on which the ceramic electronic component is mounted; wherein
the ceramic electronic component includes:
a multilayer body with a rectangular parallelepiped or rectangular parallelepiped shape and including a plurality of ceramic layers, a plurality of first inner electrode layers, and a plurality of second inner electrode layers, and including a first main surface and a second main surface opposing each other in a lamination direction, a first side surface and a second side surface opposing each other in a width direction orthogonal or substantially orthogonal to the lamination direction, and a first end surface and a second end surface opposing each other in a length direction orthogonal or substantially orthogonal to the lamination direction and the width direction;
a first outer electrode electrically connected to the plurality of first inner electrode layers and located on at least the first end surface of the multilayer body, and a second outer electrode electrically connected to the plurality of second inner electrode layers and located on at least the second end surface of the multilayer body; and
a first metal terminal electrically connecting the first outer electrode and the mounting substrate, and a second metal terminal electrically connecting the second outer electrode and the mounting substrate;

the mounting substrate includes: a first land portion electrically connected to the first outer electrode through the first metal terminal, and a second land portion electrically connected to the second outer electrode through the second metal terminal;
the mounting substrate is bonded to at least one of the first outer electrode and the multilayer body by a bonding material that electrically insulates the mounting substrate from the first outer electrode, and is bonded to at least one of the second outer electrode and the multilayer body by a bonding material that electrically insulates the mounting substrate from the second outer electrode;
while the first metal terminal maintains an elastically deformed state, a first end portion of the first metal terminal is bonded to the first outer electrode by an electrically conductive bonding material, and a second end portion of the first metal terminal is bonded to the first land portion by a bonding section with a different melting point from a melting point of the electrically conductive bonding material; and
while the second metal terminal maintains an elastically deformed state, a first end portion of the second metal terminal is bonded to the second outer electrode by an electrically conductive bonding material, and a second end portion of the second metal terminal is bonded to the second land portion by a bonding section with a different melting point from a melting point of the electrically conductive bonding material.

16. The mounting structure of the ceramic electronic component according to claim 15, further comprising:
a first screw to fix a state where the second end portion of the first metal terminal of the ceramic electronic component and the first land portion of the mounting substrate are electrically connected; and
a second screw to fix a state where the second end portion of the second metal terminal of the ceramic electronic component and the second land portion of the mounting substrate are electrically connected.

17. The mounting structure of the ceramic electronic component according to claim 15, wherein a portion where the first end portion of the first metal terminal and the first outer electrode are bonded and a portion where the first end portion of the second metal terminal and the second outer electrode are bonded are each coated by a resin.

18. The mounting structure of the ceramic electronic component according to claim 15, wherein each of the first metal terminal and the second metal terminal is coated by a resin.

19. The mounting structure of the ceramic electronic component according to claim 15, wherein each of the first metal terminal and the second metal terminal includes a comb structure including a plurality of comb-tooth portions located on the first end portion side of each of the first metal terminal and the second metal terminal, and a comb main portion located on the second end portion side of each of the first metal terminal and the second metal terminal.

20. The mounting structure of the ceramic electronic component according to claim 15, wherein each of the first metal terminal and the second metal terminal includes a plurality of terminals.

* * * * *